United States Patent [19]

Mensch, Jr.

[11] Patent Number: 5,737,613
[45] Date of Patent: Apr. 7, 1998

[54] METHOD OF OPERATING MICROCOMPUTER TO MINIMIZE POWER DISSIPATION WHILE ACCESSING SLOW MEMORY

[76] Inventor: William D. Mensch, Jr., 1924 E. Hope St., Mesa, Ariz. 85203

[21] Appl. No.: 401,885

[22] Filed: Mar. 10, 1995

Related U.S. Application Data

[62] Division of Ser. No. 111,379, Aug. 24, 1993.
[51] Int. Cl.⁶ .................................................. G06F 1/32
[52] U.S. Cl. ......................... 395/750.04; 395/750.01
[58] Field of Search ............................ 395/800, 850, 395/750, 800.01, 750.4, 750.01

[56] References Cited

U.S. PATENT DOCUMENTS

| | | | |
|---|---|---|---|
| 5,123,107 | 6/1992 | Mensch, Jr. ................. | 395/800 |
| 5,319,771 | 6/1994 | Takeda ......................... | 395/550 |
| 5,450,574 | 9/1995 | Madter et al. ................ | 395/550 |

*Primary Examiner*—Alyssa H. Bowler
*Assistant Examiner*—John Follansbee
*Attorney, Agent, or Firm*—Cahill, Sutton & Thomas P.L.C.

[57] ABSTRACT

A method of operating a CMOS microcomputer to minimize power dissipation while accessing a plurality of memories including a first memory operable at a first frequency, a second memory operable at a lower second frequency, including operating the entire CMOS microcomputer at the first frequency while accessing the first memory, causing the CMOS microcomputer to dissipate power at a first level, determining from a user program currently being executed that it is necessary to access the second memory, and operating the entire CMOS microcomputer at the lower second frequency while accessing the second memory to cause the CMOS microcomputer to dissipate power at a second level which is lower than the first level. The user program is executed to set a first speed control bit to a first level indicating that the second memory is to be accessed at the second frequency, and the second frequency is selected as a system clock frequency for the entire CMOS microcomputer in response to the first level of the first speed control bit. The second frequency is selected as the system clock frequency in response to a coincidence of one of a plurality of speed control bits and a corresponding one of a plurality of chip control outputs.

7 Claims, 21 Drawing Sheets

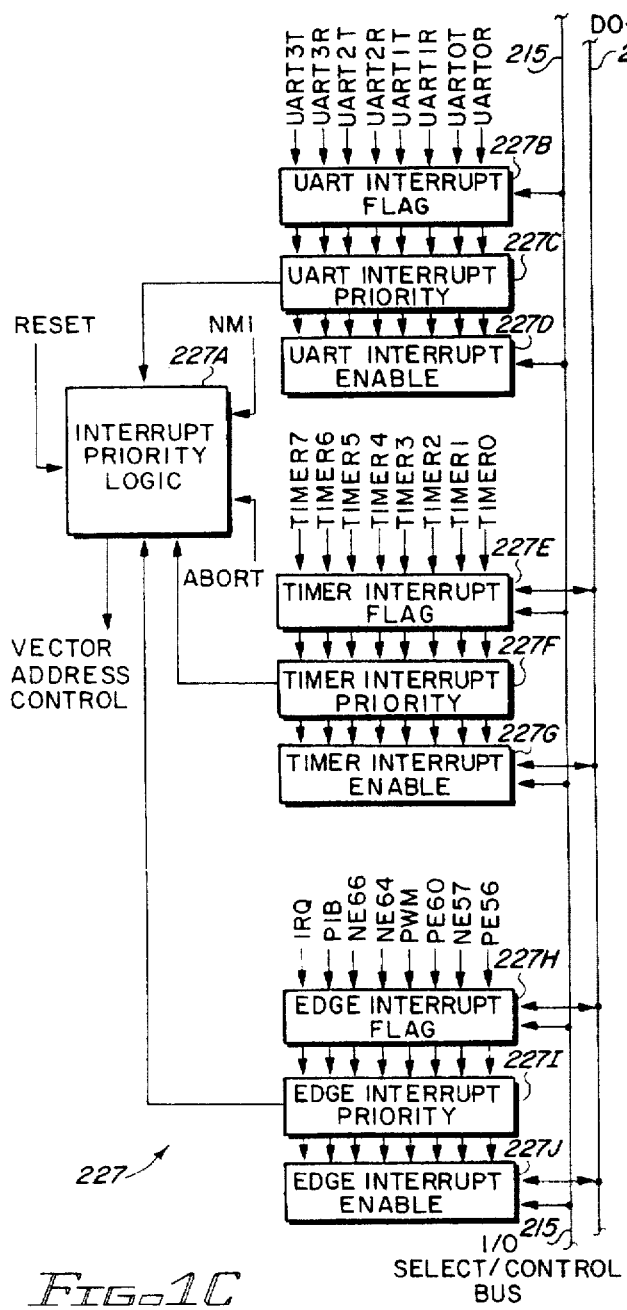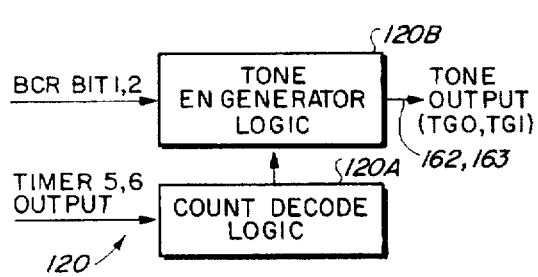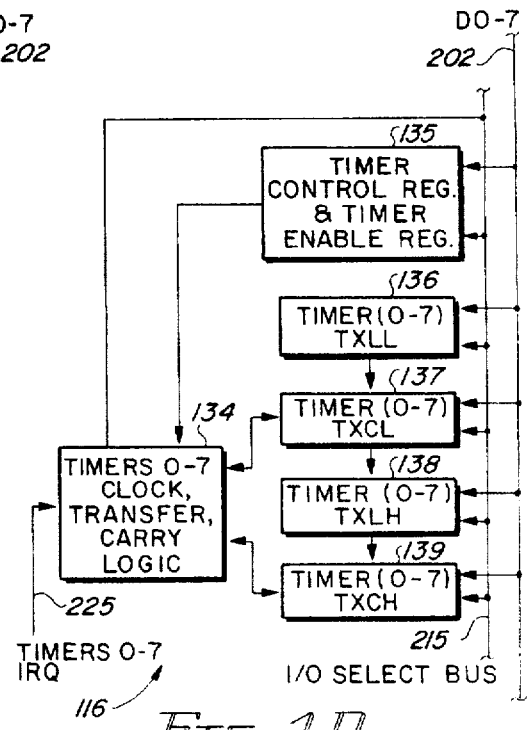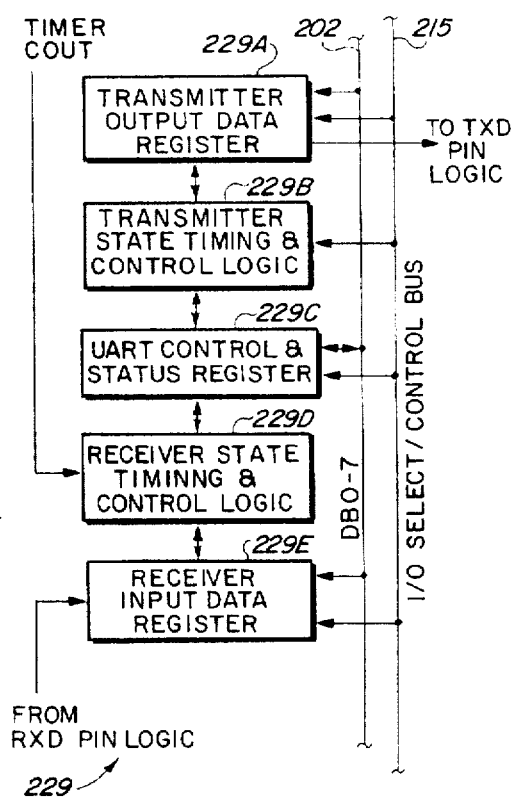

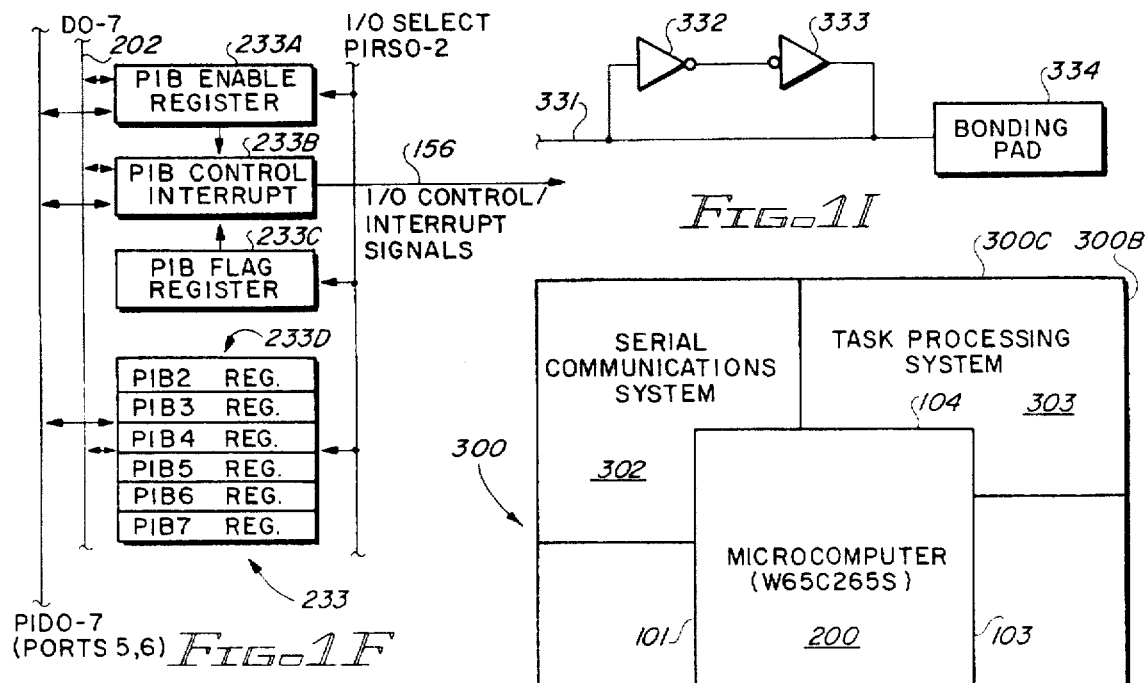
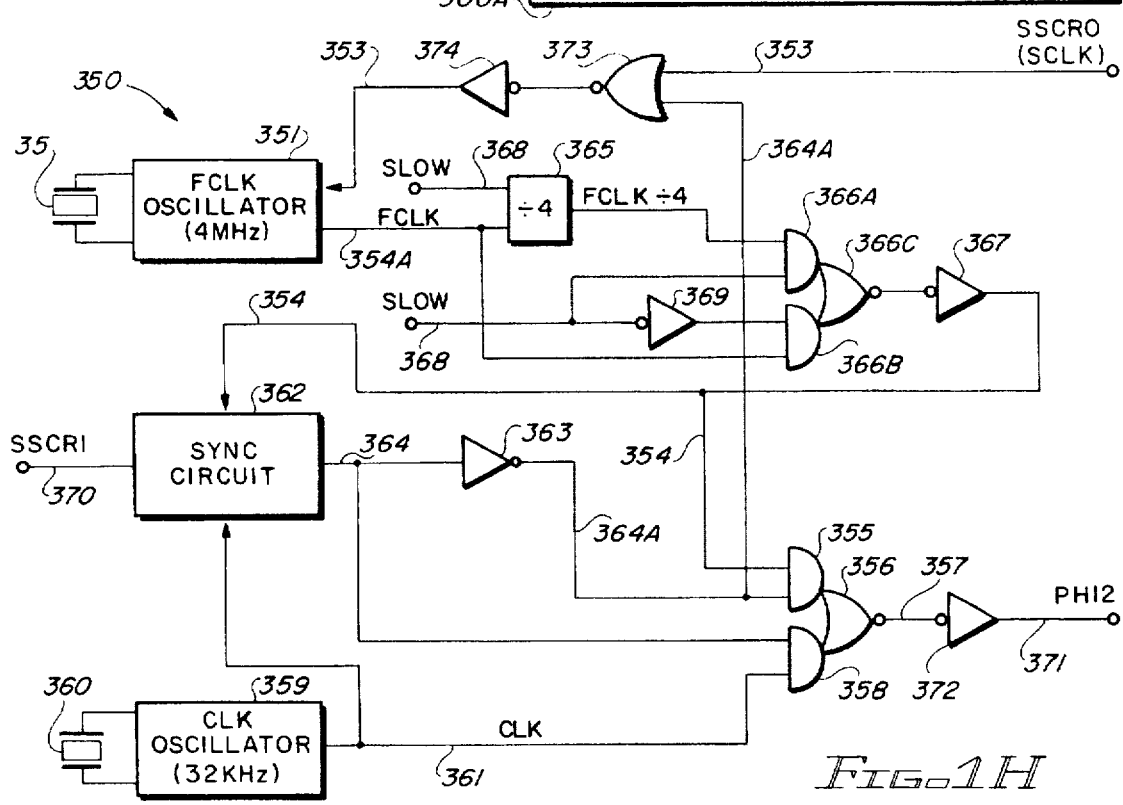

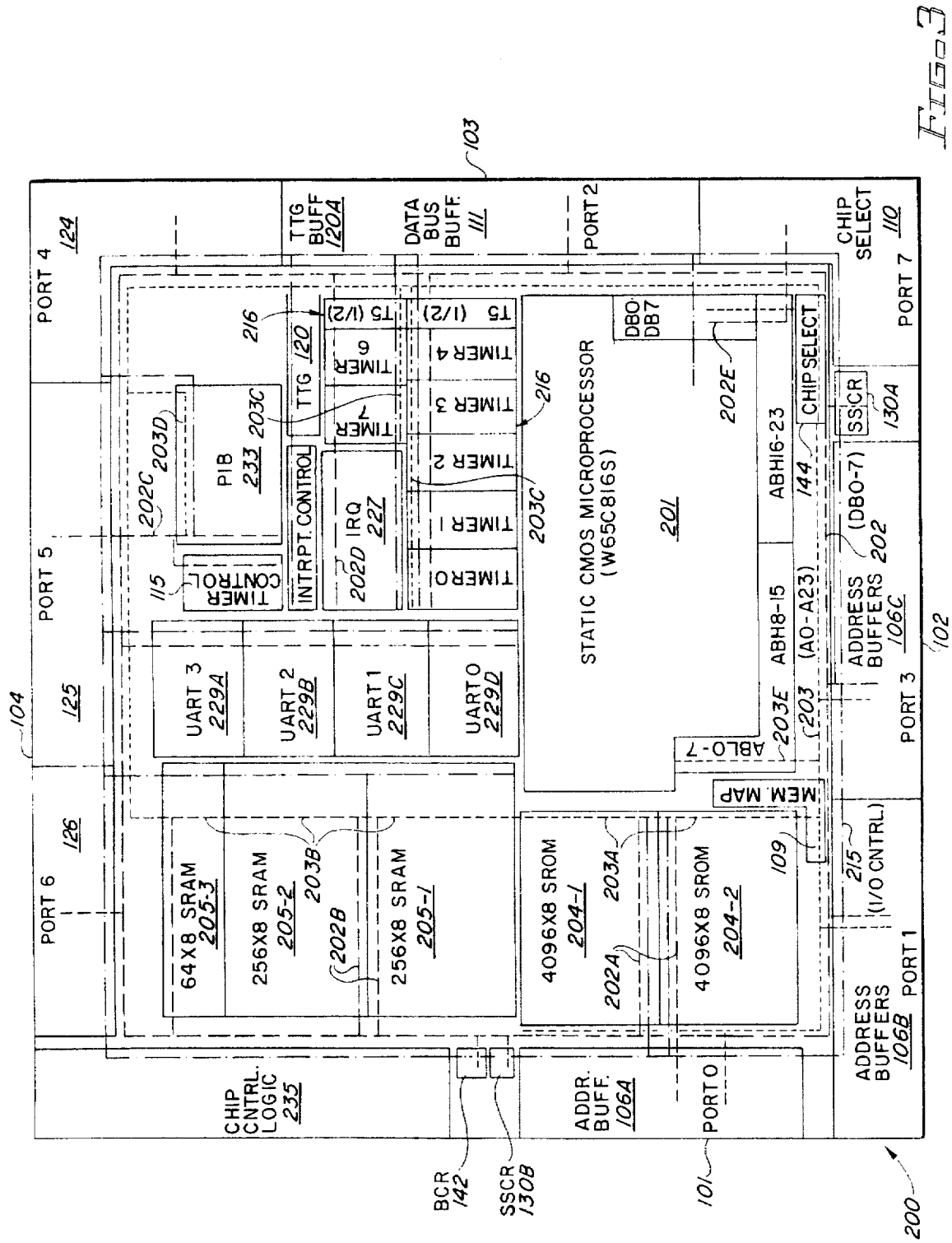

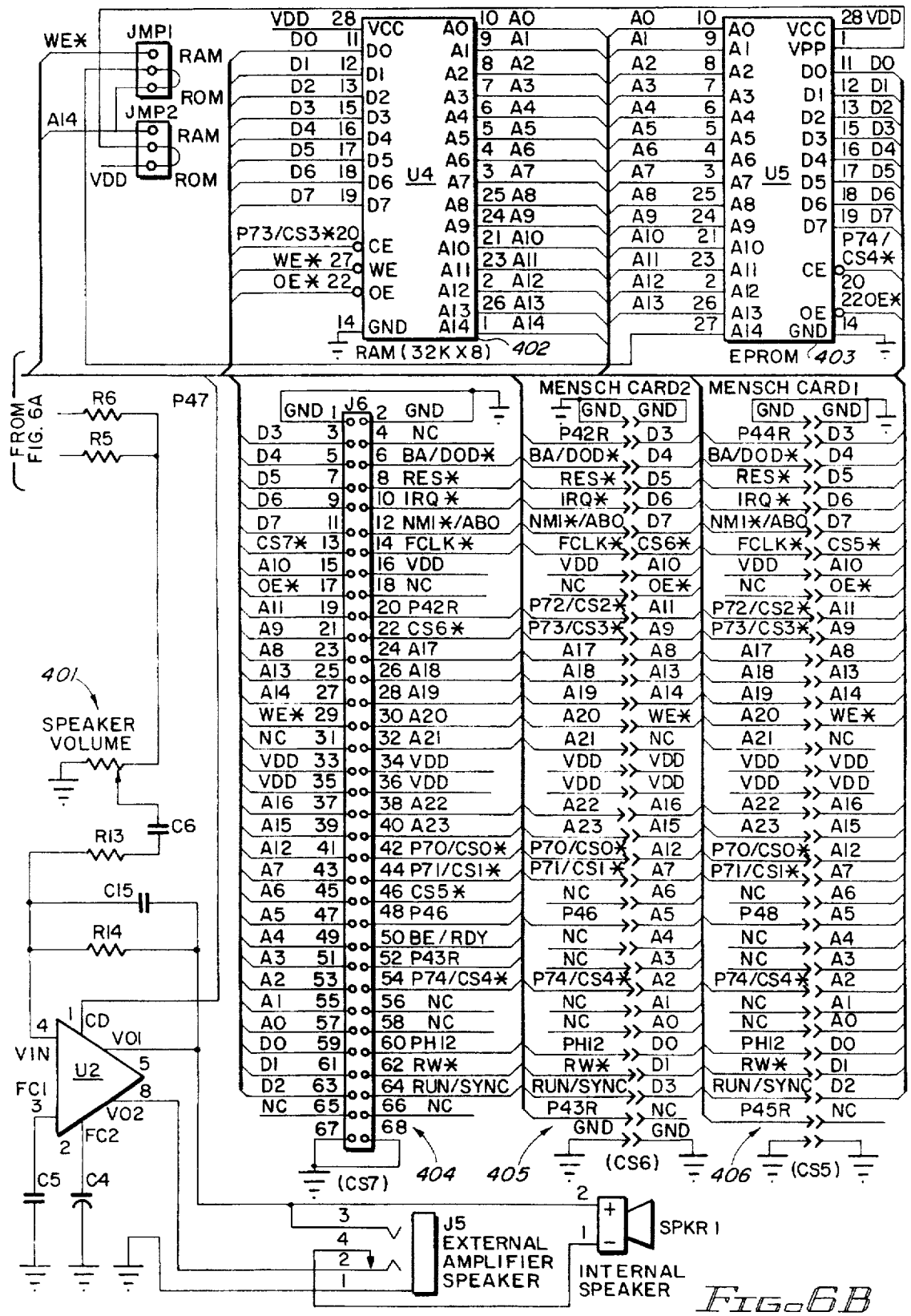

5,737,613

METHOD OF OPERATING MICROCOMPUTER TO MINIMIZE POWER DISSIPATION WHILE ACCESSING SLOW MEMORY

This is a division of application Ser. No. 08/111,379, filed Aug. 24, 1993.

BACKGROUND OF THE INVENTION

The invention relates to an efficient topography for a CMOS microcomputer including a sixteen bit static low power CMOS microprocessor, 8192 bytes of ROM, 576 bytes of RAM, eight chip select outputs, eight 16 bit timers with maskable interrupts, four UARTs, 29 priority encoded interrupts, built in de-bug features, a bus control register for external memory bus control, interface circuitry for I/O devices, time of day clock features, twin tone generators, a bus control register for external memory bus control, an abort input for low cost virtual memory interface, a high performance interrupt driven parallel bus interface, and system speed control circuitry to allow the microprocessor access to both slow and fast memories and I/O interface and to effectuate automatic reduction of overall system power.

My U.S. Pat. Nos. 4,652,992 and 4,739,475 fully describe the topography and logic circuitry of commercially available processors known as the W65C602S and W65C816S microprocessors, respectively. My U.S. Pat. No. 5,123,107 issued Jun. 16, 1992 entitled "TOPOGRAPHY OF CMOS MICROCOMPUTER INTEGRATED CIRCUIT CHIP INCLUDING CORE PROCESSOR AND MEMORY, PRIORITY, AND I/O INTERFACE CIRCUITRY COUPLED THERETO", incorporated herein by reference, fully describes the topography of a microcomputer integrated circuit chip, known as the W65C134S, including a W65C602S as a "core" processor, and also including memory, priority, and I/O interface circuitry coupled to the core microprocessor. Microprocessors generally contain an internal address bus, an internal data bus, a number of registers including an accumulator, a program counter, an internal data latch, stack pointer registers, index registers, an arithmetic logic unit, an instruction register, a status register, and instruction decoding circuitry, register transfer logic, and data buffer latches and address latches. Microprocessors do not ordinarily contain additional components that are needed in a microcomputer system, such as a read only memory for storing programs, a random access memory for storing variables and data, timers, UARTs, I/O functions, priority interrupt systems and the like. However, with the wide availability and commercial success of quite a number of microprocessors, various suppliers have begun using commercially available microprocessor designs as "embedded" cores of larger microcontrollers or microcomputers on single silicon chips that include not only the microprocessor, but also some or all of the above-mentioned components and other components.

The foregoing integrated circuit topography design considerations and constraints make it a considerable challenge to design a microcomputer or microcontroller utilizing an already designed layout for the microprocessor "core" section. Positioning of the core microprocessor, the ROM, RAM, UART, timers, bus control register, and interface circuitry, etc. must be accomplished in such a way as to allow the microprocessor to interface easily on a printed circuit board with other ASIC's (applications specific integrated circuits) designed by the user to implement a larger system. Difficult tradeoffs must be established between the often opposing objectives of (1) minimizing total semiconductor area occupied by the microcomputer and (2) making connection to many leads of the microcomputer which have to be located in certain positions for reasons that are unrelated to minimizing microcomputer chip area.

In some applications of a microcomputer it may be desirable to access off-chip memory, such as slow EPROM, SRAM or DRAM and fast on-chip SRAM and SROM. It would be very desirable for the entire microcomputer to be able to automatically operate at various fast and slow speeds while accessing various on-chip and off-chip memories and/or peripheral devices, because many applications of microcomputers require use of battery power, and consequently it would be very desirable for microcomputers used in such applications to be able to automatically minimize the system power consumption according to the demands of the program or routines currently being executed. Conventional computers continue to operate at a fast cycle rate during a slow memory access, using wait states or the like to effectuate accessing of slower blocks of memory to allow the processor to continue to perform functions.

The closest prior art known to me is the W65C134S microcontroller, fully described in above U.S. Pat. No. 5,123,107, which I designed and now market through my company. The Western Design Center, Inc. of Mesa, Ariz. The function and topography of the W65C134S was a substantial improvement over the earlier W65C124S, which did not succeed in adequately meeting the objectives of a general purpose microcomputer that can be easily interfaced to a wide variety of ASIC's or other circuitry likely to be required by a user in implementing a larger microcomputer system.

There is a presently unmet need for an efficient topography for a microcomputer including the W65C816S or other CMOS microprocessor and a variety of peripheral ROM, RAM, UART, priority interrupt, and other functions on a single chip. There is a presently unmet need for a more powerful microcomputer that can operate with lower power consumption than previously has been practical.

SUMMARY OF THE INVENTION

Accordingly, it is an object of the invention to provide an economical topography for a CMOS microcomputer utilizing a W65C816S sixteen bit microprocessor core and including ROM, RAM, UART, I/O interface, priority interrupt, timer, and peripheral interface circuitry arranged to minimize chip area and optimize connection of the microcomputer circuitry to logic circuitry with which the microcomputer must be interfaced.

It is another object of the invention to provide an integrated circuit microcomputer system chip having peripheral circuitry that is arranged so as to minimize chip area, the chip utilizing a microcomputer as a "core", the chip including I/O circuitry, task processing circuitry, and memory circuitry, all of which are external to the microcomputer core.

It is another object of the invention to provide a microcomputer chip which is capable of automatically switching between very low dynamic power levels and also is able to operate at high speeds.

It is another object of the invention to provide a microcomputer that is capable not only of serving as a "core"of a larger microcomputer system, but also is able to function as a "master", rather than a "slave" to the larger microcomputer system.

It is another object of the invention to provide a microcomputer chip that has a very wide range of capabilities for interfacing as a "core" to a larger microcomputer system by providing a number of positive and negative-going edge-sensitive interrupts, level-sensitive interrupts, serial and parallel communications capability, and the capability of efficiently accessing internal and external memory and peripheral devices having substantially different speeds.

It is another object of the invention to provide a microcomputer that functions more effectively and efficiently as a "core" of a larger microcomputer system than the W65C134S microcomputer.

It is another object of the invention to provide a microcomputer having the capability of greatly reducing power consumption under software control.

Briefly described, and in accordance with one embodiment thereof, the invention provides an integrated circuit CMOS microcomputer including first, second, third, and fourth consecutive edges. The microcomputer includes a microprocessor including (i) address output buffer means located along a lower left edge and a bottom edge of the microprocessor, (ii) data bus buffer means located along a right edge of the microprocessor, and (iii) interrupt circuitry located along the upper edge of the microprocessor. A plurality of low order address buffer circuits are located along a lower part of the first edge, adjacent to the address output buffer means of the microprocessor. A plurality of high order address buffer circuits are located along a left and mid-portion of the second edge, adjacent to the address buffer means of the microprocessor. Chip selection output circuitry is located along a right part of the second edge and a lower part of the third edge. A plurality of data bus buffer circuits are located along a mid-portion of the third edge. SROM circuitry is located in a lower left portion of the microcomputer adjacent to the low order address buffers and the high order address buffers. The microprocessor is located in the lower middle and right portions of the microcomputer chip between the SROM circuitry and the data bus buffers, and adjacent to and above a portion of the high order address buffers. SRAM circuitry is located directly above the SROM circuitry and adjacent to a first group of interface circuits disposed along the fourth edge. A plurality of I/O interface circuits are located along the first, second, third, and fourth edges among the various low order and high order address buffer circuits, data bus buffer circuits, interrupt circuits, and first group of interface circuits, and are multiplexed therewith to a plurality of external terminals, respectively, of the low order and high order address buffer circuits, the data bus buffer circuits, the interrupt circuits, and the first group of interface circuits. A plurality of UARTs, a plurality of timers, a parallel interface bus circuit, a tone generator circuit, and an interrupt controller are located above the microprocessor between the SRAM circuitry and the data bus buffers, the interrupt controller being surrounded by the UARTs, timers, and parallel interface bus circuit. Chip control circuitry is located along an upper part of the first edge operatively coupling the microprocessor to the SRAM circuitry and to the SROM circuitry, the first group of interface circuits, the chip selection output circuitry, the high and low order address buffer circuits, the data bus buffer circuits, the timers, and the I/O interface circuits.

A method is disclosed for operating the CMOS microcomputer chip to minimize power dissipation while accessing a plurality of memories including a first memory operable at a first frequency, a second memory operable at a second frequency, the first memory cycle frequency being higher than the second. The entire CMOS microcomputer chip is operated at the first frequency while accessing the first memory, causing the CMOS microcomputer chip to dissipate power at a first level. It then is determined from a program currently being executed when the second memory needs to be accessed, and the entire CMOS microcomputer chip then is operated at the second frequency during accessing of the second memory, causing the microcomputer chip to dissipate power at a second level which is lower than the first level. In the described embodiment, the first memory is an on-chip memory and the second memory is external to the CMOS microcomputer chip. To this end, the program is executed to set a first speed control bit to a first level indicating the next memory access is to be at the second frequency. The second frequency is selected as the system clock frequency for the entire CMOS microcomputer chip in response to the first level of the first speed control bit. A fast clock having the first frequency is divided by a predetermined factor in response to the first level of the first speed control bit to derive the second frequency. The second frequency is selected as the system clock frequency in response to the coincidence of one of a plurality of speed control bits and a corresponding one of a plurality of chip control outputs, wherein the microcomputer chip includes a speed control register and a chip select output decoder that decodes memory addresses to produce a plurality of chip select outputs. The program is executed to enter information into bits of the speed control register to determine whether a fast clock source or a slow clock source is to be selected to determine the frequency at which the microcomputer chip is to be operated, to determine whether a signal from the fast clock source is to be divided to derive a divided down frequency at which the entire microcomputer chip is to be operated, and to determine which of the plurality of chip select outputs must be produced in coincidence with information in the speed control register to cause the entire microcomputer chip to operate at the divided down frequency.

BRIEF DESCRIPTION OF THE DRAWINGS

FIGS. 1C–1I are detailed logic diagrams of various blocks in FIGS. 1 and 1A.

FIG. 3 is a block diagram generally illustrating locations of major circuit sections of the CMOS microcomputer of FIGS. 1A and 1B a semiconductor chip.

FIG. 3A is a block diagram of the topography of a microcomputer system including the microcomputer of the present invention used as a "core" around which a larger microcomputer system is fabricated on a single semiconductor chip.

FIGS. 5A–5K are scale computer plots of photomasks used to pattern the various integrated circuit layers during the manufacture of the CMOS microcomputer.

FIGS. 6A and 6B constitute a block diagram of a low cost, high performance computer implemented using the microcomputer chip of FIGS. 1A and 1B.

DETAILED DESCRIPTION OF THE PREFERRED EMBODIMENT

Figure 1A:
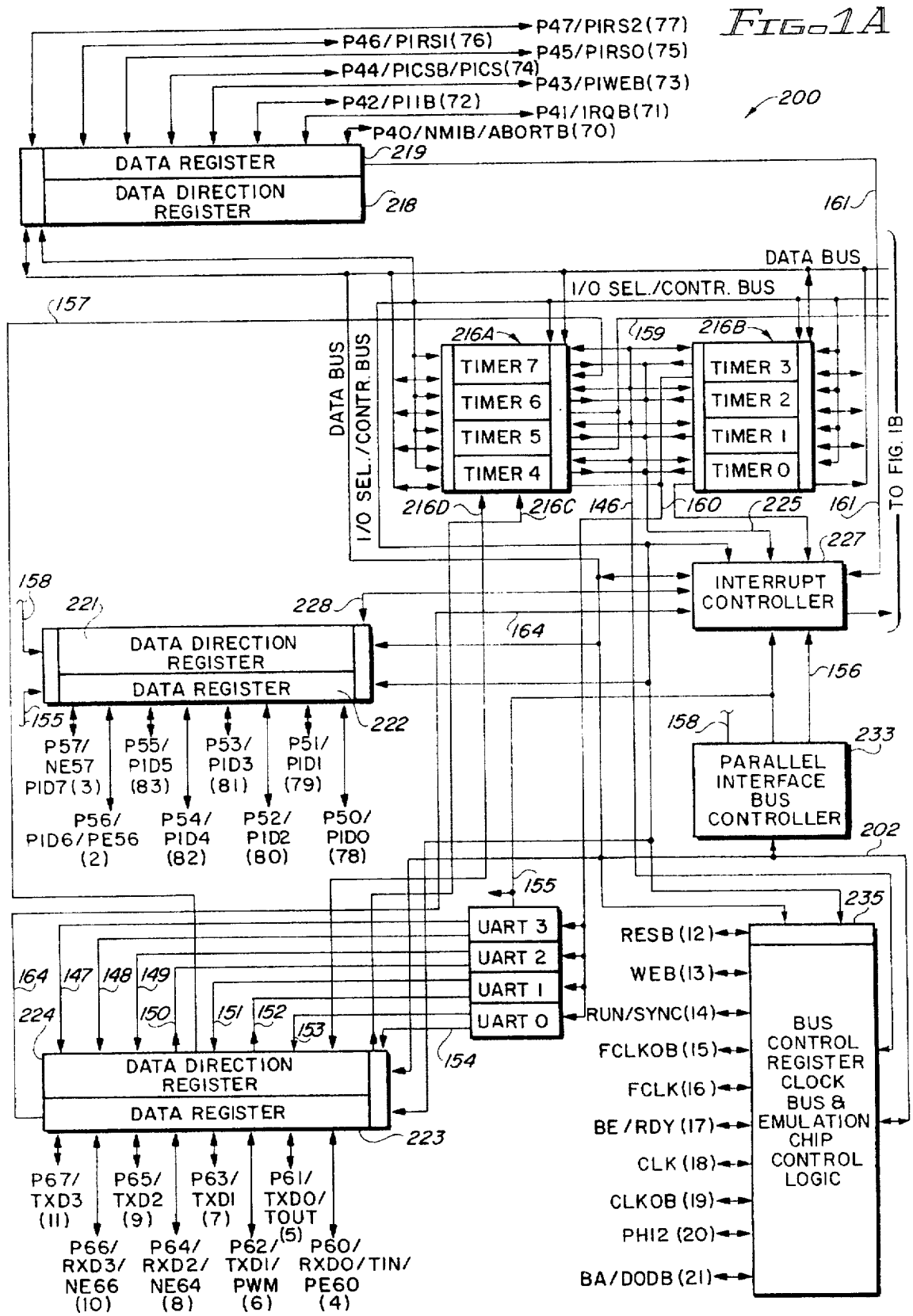
FIGS. 1A and 1B constitute a block diagram showing the architecture of the microcomputer of the present invention.
Figure 1B:
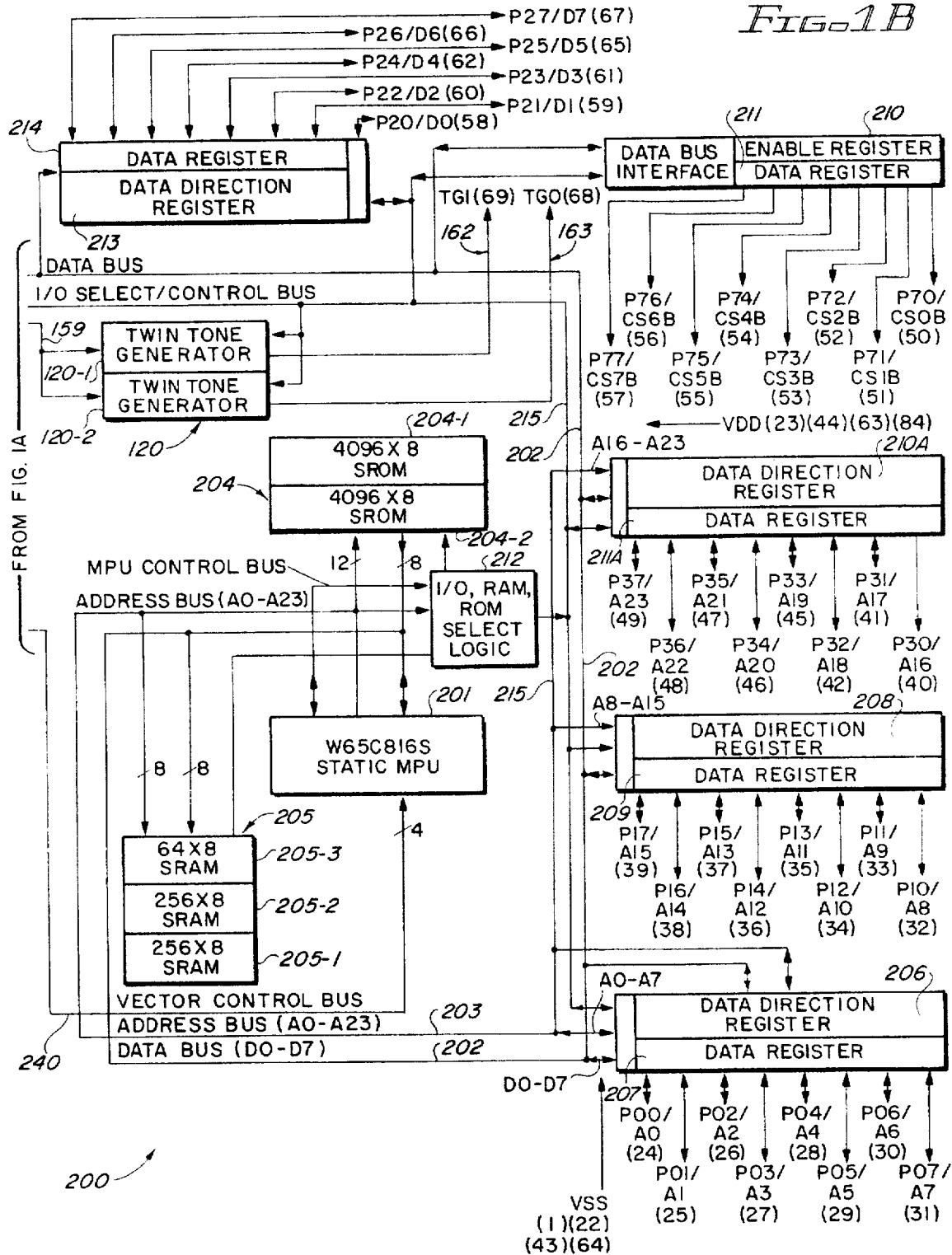

The block diagram of FIGS. 1A and 1B shows a single chip CMOS microcomputer 200 that includes a microprocessor 201, two 256 word by eight bit and one 64 word by eight static RAMs (SRAMs) 205, two 4096 word by eight bit static ROMs (SROMs) 204, and I/O, RAM, and ROM select logic 212. Microcomputer 200 also includes data register 207 and data direction register 206 for Port 0 I/O terminals P00–P07, and address latches for address bus outputs A0–A7. Note that most of the leads of microprocessor 200 have two or three signals multiplexed thereon. In the drawings, slashes (/) separate the names of signals multiplexed onto a particular lead. The pin numbers of the leads are indicated in parentheses. Accordingly, a particular lead will be referred to by the name of the particular signal presently being discussed.

Data register 209 and data direction register 208 are provided for Port 1 I/O leads P10–P17, and address latches are provided for address outputs AS–A15. Enable register 210 and data register 211 are provided for Port 7 outputs P70–P77, and latches are provided for chip select outputs CS0–CS7. Data direction register 213 and data register 214 are provided for Port 2 I/O conductors P20–P27, and data input/output latches are provided for data bus conductors D0–D7.

Data Direction-Register 210A and a Data Register 211A are provided for Port 3 outputs P30–P37 and address outputs A16–A23.

Microcomputer 200 also includes data direction register 218 and Data Register 219 for I/O Port 4 conductors P40–P47, and input buffers for the signals NMIB, ABORTB, IRQB, PIIB, PIWEB, PICSB, PICS, PIRS0, PIRS1, and PIRS2. (Note that the concluding letters "B" on signal names herein represent logical complements; e.g. NMIB means $\overline{NMI}$.) Data direction register 221 and data register 222 are coupled to Port 5 I/O conductors P50–P57, input buffers are provided for edge-sensitive interrupt inputs PE56 and NE57, and parallel interface bus PID0–PID7.

Microcomputer chip 200 also includes four universal asynchronous receiver transmitters (UARTs) 229. Block 235 includes a bus control register, clock circuitry, bus control circuits, and de-bug control logic circuitry. Block 235 is connected to conductors of the signals RESB, WEB, RUN/ SYNC, FCLK0, FCLK, BE/RDY, CLK, CLK0, PHI2, and a conductor 146 that also is connected to Timers 0–7. Microcomputer 200 further includes a parallel interface bus controller (PIB) circuit 233, interrupt controller circuitry 227, and blocks 216A and 216B containing eight Timers 0–7.

Eight bit data bus 202 is connected to microprocessor 201, SRAM 205, SROM 204, all of the data direction registers, all of the timers, interrupt controller 227, UARTs 229, chip control logic 235, and timers 0–7. Address bus 203 is connected to data direction registers 206, 208, and 210A, to SRAM 205, SROM 204, and I/O, RAM, ROM select logic 212. I/O Control Bus 215 (which also includes address bits A0–A3), RESET, WEB, PHI2, and decoded 16 byte memory block select signals, is connected to I/O, RAM, ROM select logic in block 212, to all of the data and direction registers, and to chip control logic block 235. Note that all of the data and data direction register circuits in FIGS. 1A and 1B include interface circuitry to control and connect the data and data direction registers to the data bus and various other conductors.

Interrupt controller 227 is connected by conductors 228 to data direction register 221, by vector control bus 240 to microprocessor 201, by conductor 164 to Data Register 223, and by conductor 161 to Data Register 219. Interrupt controller 227 also is connected by data bus 202 to all of the data direction registers, UARTs 229, to chip control block 235, by conductors 225 to Timers 0–7, by conductors 227B to microprocessor 201, and by conductors 156 to parallel interface bus controller 233. Parallel interface bus controller 233 is connected by conductors 158 to port 5 data direction register 221. Parallel interface bus controller 233 also is connected by conductor 155 to interrupt controller 227, UART 3, and data register 222.

Microprocessor 201 is identical to a W65C816S CMOS microprocessor marketed by the Western Design Center, Inc. of Mesa, Ariz. The structure and topography of the W65C618S microprocessor are described in detail in my U.S. Pat. No. 4,739,475, filed Nov. 28, 1984, issued on Apr. 19, 1988, entitled "Topography for Sixteen Bit CMOS Microprocessor with Eight Bit Emulation and Abort Capability", incorporated herein by reference.

Microcomputer chip 200 is the W65C265S recently introduced by the Western Design Center, Inc., of Mesa, Ariz. It is fabricated on a single chip, composed entirely of CMOS circuitry, and packaged in the 84 lead package or chip carrier represented by the diagram of FIG. 2. FIG. 2A shows the wire bonding diagram connections to the pads of the W65C265S microcomputer chip 200 shown in FIG. 5. Microcomputer 200 also can be used as the "core" 200A of a larger microcomputer system 300 that is implemented on a single silicon chip as shown in FIG. 3A.

Before describing the topography of microcomputer 200, its main functional blocks will be described, and the functions of various package leads 1–84 also will be described.

8192 byte ROM 204 contains user program instructions and fixed constants which are mask-programmed into SROM 204 during fabrication. 576 byte SRAM 205 contains the user program stack and also is used as a scratch pad memory during system operations.

A bus control register in block 235 controls various modes of I/O (input/output) and external memory interface. The voltage of the BE/RDY lead (17) during power-up determines the initial values of bits in the bus control register (BCR) to set up microcomputer 200 for de-bug or test modes, if desired. Bit 0 of the bus control register determines if the leads of I/O ports 0, 1, 2, and 3 are to function as I/O port leads or as address bus and data bus leads for external memory or external I/O access. The edge interrupt enable register and the edge interrupt flag register of the W65C2655 contain the enable bit and the flag bit associated with the edge interrupt inputs PE56, NE57, PE60, PWM (pulse width measurement), NE64, NE66, PIB interrupt, and IRQ level interrupt signals.

Referring to FIG. 1C, interrupt flag registers in interrupt controller 227 contain a bit which is set in response to a signal from a source. A read from an interrupt flag register transfers its value to the internal data bus 202. A write of a "1" to any bit of the internal flag registers clears that bit. If more than one bit of an interrupt flag register is set and enabled, a vector corresponding to the highest bit number set is used to thereby establish interrupt priority. Interrupt registers in block 227, when read, output their contents onto the internal data bus 202. Writing an interrupt enable register in block 227 writes a value from the internal data bus 202 into the interrupt enable register. Setting a bit in an interrupt enable register to a "1" permits the corresponding bit in the interrupt flag register to interrupt microprocessor 201.

As shown in FIG. 1C, interrupt controller 227 includes priority logic 227A connected to receive the RESET, timer interrupt priority signals, edge interrupt priority signals, and UART interrupt priority signals. Priority logic 227A receives the NMI and ABORT signals and the vector address control signals. The UART interrupt flag signals are received by interrupt flag register 227B, which controls interrupt priority circuit 227C, as does UART interrupt enable circuit 227D. Timer interrupt flag register 227E is connected to Timers 0–7, and controls timer interrupt priority logic 227F in response to that and timer interrupt circuit 227G. Edge interrupt priority circuit 227I responds to edge interrupt flag register 227H and edge interrupt enable register 227J to generate the edge interrupt priority signals.

The functions of timers 0–7 are as follows: Timer T0 functions as a monitor watchdog timer. Timer T1 functions as a time of day timer. Timer T2 provides a pre-scaled (with respect to time) interrupt function. Timer T3 controls the UART baud rate. Timer 4 controls both setting of the UART baud rate and timing of pulses on lead P60 through conductor 216C or generation of a pulse on P61 through conductor 216D. Timers T5 and T6 control the tone generators. Timer T7 controls the pulse width measurement (PWM) function from lead P62 through conductor 216C.

FIG. 1D shows the timer circuits 216, which include clock, transfer and carry logic 134 that responds to the timer IRQ signals and timer control register 135. Circuitry 134 also is coupled to the timer TXCH circuit 139 and timer TXCL circuit 137 and to the I/O control bus 215. The i/O control bus 215 is connected to blocks 135, 136, 137, 138, and 139. I/O control bus 215 and data bus 202 are connected to blocks 135–139.

Each of the UARTs 229 is a conventional full duplex universal asynchronous receiver/transmitter with programmable bit rates. A block diagram is shown in FIG. 1E. Each UART includes a transmitter output data register 229A, a transmitter timing and control circuit 229B, a UART status and control register 229C, a receiver timing and control circuit 229D, and a receiver input data register 229E. its serial input and output functions are controlled by the asynchronous control and status register (ACSR) 229C of FIG. 1F. The serial bit rate of UART 229 is determined by Timer 3 or 4.

The parallel interface bus circuit 233, shown in FIG. 1F. is intended for inter-chip communications in parallel "task" processing applications, such as display control. The parallel interface bus (PIB) circuit 233 has a PIB Enable register 233A connected to the I/O select PIRS 0–2 conductors, data bus conductors D1–7, PID 0–7 conductors of port 5 and 6, and PIB control interrupt circuit 233B. PIB Flag register 233C associated with its use, also is connected to the PID 0–7 conductors, the I/O select PIRS 0–2 conductors, the D0–7 conductors, and PIB control interrupt circuit 223B, which generates I/O control/interrupt signals in response to the PIB enable and flag registers. PIB circuit 233 also includes six registers 233D coupled to data bus 202, to PIRS 0–2 register select conductors, and the PID 0–7 data conductors coupled to Ports 5 and 6. Parallel bus handshaking is controlled in response to the I/O control interrupt signals 150.

Each of tone generators 120-1 and 120-2 has the configuration 120 shown in FIG. 1G, including a count decode circuit 120A responsive to the Timer 5 or 6 output so as to control tone generator logic 120B, which is enabled by BCR bit 1 or 2 to produce a tone output on conductor 162 or 163.

Table 1 below lists the package lead numbers 1–84 of microcomputer 200, and identifies the one, two, or three signals multiplexed onto each of package leads 1-84, and also identifies the bit of the bus control register, asynchronous control and status register, etc. which determines which of the two or three identified signals is in effect. "BCRx" refers to bit x in the bus control register. "ACSRx" refers to bit x in the asynchronous control and status register 229C of FIG. 1F. "TCRx" refers to bit x in the timer control register. "PCSx" refers to bit x of the programmable chip select register in block 210 of FIG. 1A and 1B. The PCSx bit determines whether package leads 37–44 function as programmed outputs or chip select outputs.

TABLE 1

| Pin | Name | Control Bit | Signal with Control Bit=0 | Signal with Control Bit=1 |
|---|---|---|---|---|
| 1 | VSS | — | VSS | VSS |
| 2 | P56/PE56/PID6 | BCR4 PIBER0 | P56 | PE56 PID6 |
| 3 | P57/NE57/PID7 | BCR4 PIBER0 | P57 | NE57 PID7 |
| 4 | P60/RXD0/TIN | ACSR05 TCR1 | P60 | RXD0 TIN |
| 5 | P61/TXD0/TOUT | ACSR00 TCR0 | P61 | TXD0 TOUT |
| 6 | P62/RXD1/PWM | ACSR15 TCR2+TCR3 | P62 | RXD1 PWM |
| 7 | P63/TXD1/TOUT | ACSR10 | P63 | TXD1 |
| 8 | P64/RXD2 | ACSR25 | P64 | RXD2 |
| 9 | P65/TXD2 | ACSR20 | P65 | TXD2 |
| 10 | P66/RXD3 | ACSR35 | P66 | RXD3 |
| 11 | P67/TXD3 | ACSR30 | P67 | TXD3 |
| 12 | RESB | — | RESB | RESB |
| 13 | WEB | — | WEB | WEB |
| 14 | RUN/SYNC | BCR3 | RUN | RUN/SYNC |
| 15 | FCLKOB | — | FCLKOB | FCLKOB |
| 16 | FCLK | — | FCLK | FCLK |
| 17 | BE/RDY | — | BE/RDY | BE/RDY |
| 18 | CLK | — | CLK | CLK |
| 19 | CLKOB | — | CLKOB | CLKOB |
| 20 | PHI2 | — | PHI2 | PHI2 |
| 21 | BA/DODB | BCR3 | BA/1 | BA/DODB |
| 22 | VSS | — | VSS | VSS |
| 23 | VDD | — | VDD | VDD |
| 24 | P00/A0 | BCR0 | P00 | A0 |
| 25 | P01/A1 | BCR0 | P01 | A1 |
| 26 | P02/A2 | BCR0 | P02 | A2 |
| 27 | P03/A3 | BCR0 | P03 | A3 |
| 28 | P04/A4 | BCR0 | P04 | A4 |
| 29 | P05/A5 | BCR0 | P05 | A5 |
| 30 | P05/A6 | BCR0 | P06 | A6 |
| 31 | P07/A7 | BCR0 | P07 | A7 |
| 32 | P10/A8 | BCR0 | P10 | A8 |
| 33 | P11/A9 | BCR0 | P11 | A9 |
| 34 | P12/A10 | BCR0 | P12 | A10 |
| 35 | P13/A11 | BCR0 | P13 | A11 |
| 36 | P14/A12 | BCR0 | P14 | A12 |
| 37 | P15/A13 | BCR0 | P15 | A13 |
| 38 | P16/A14 | BCR0 | P16 | A14 |
| 39 | P17/A15 | BCR0 | P17 | A15 |
| 40 | P30/A16 | BCR0 | P30 | A16 |
| 41 | P31/A17 | BCR0 | P31 | A17 |
| 42 | P32/A18 | BCR0 | P32 | A18 |
| 43 | VSS | — | VSS | VSS |
| 44 | VDD | — | VDD | VDD |
| 45 | P33/A19 | BCR0 | P33 | A19 |
| 46 | P34/A20 | BCR0 | P34 | A20 |
| 47 | P35/A21 | BCR0 | P35 | A21 |
| 48 | P36/A22 | BCR0 | P36 | A22 |
| 49 | P37/A23 | BCR0 | P37 | A23 |
| 50 | P70/CS0B | PCS70 | P70 | CS0B |
| 51 | P71/CS1B | PCS71 | P71 | CS1B |
| 52 | P72/CS2B | PCS72 | P72 | CS2B |
| 53 | P73/CS3B | PCS73 | P73 | CS3B |
| 54 | P74/CS4B | PCS74 | P74 | CS4B |
| 55 | P75/CS5B | PCS75 | P75 | CS5B |
| 56 | P76/CS6B | PCS76 | P76 | CS6B |

TABLE 1-continued

| Pin Name | Control Bit | Signal with Control Bit=0 | Signal with Control Bit=1 |
|---|---|---|---|
| 57 P76/CS7B | PCS77 | P77 | CS7B |
| 58 P20/D0 | BCR0 | P20 | D0 |
| 59 P21/D1 | BCR0 | P21 | D1 |
| 60 P22/D2 | BCR0 | P22 | D2 |
| 61 P23/D3 | BCR0 | P23 | D3 |
| 62 P24/D4 | BCR0 | P24 | D4 |
| 63 VDD | — | VDD | VDD |
| 64 VSS | — | VSS | VSS |
| 65 P25/D5 | BCR0 | P25 | D5 |
| 66 P26/D6 | BCR0 | P26 | D6 |
| 67 P27/D7 | BCR0 | P27 | D7 |
| 68 TG0 | TCR31 | — | TG0 |
| 69 TG1 | TCR33 | — | TG1 |
| 70 P40/NMIB/ ABORTB | BCR5·BCR6 BCR5·BCR6B | P40 | NMIB ABORTB |
| 71 P41/IRQB | EIER3 | P41 | IRQB |
| 72 P42/PIIB | PIBER0 | P42 | PIIB |
| 73 P43/PIWEB/ PIWRB | PIBER0·PIBER1B PIBER0·PIBER1 | P43 | PIWEB PIWRB |
| 74 P44/PICSB/ PIRDB | PIBER0·PIBER1B PIBER0·PIBER1 | P44 | PICSB PIRDB |
| 75 P45/PIRS0 | PIBER0 | P45 | PIRS0 |
| 76 P46/PIRS1 | PIBER0 | P46 | PIRS1 |
| 77 P47/PIRS2 | PIBER0 | P47 | PIRS2 |
| 78 P50/PD0 | PIBER0 | P50 | PID0 |
| 79 P51/PID1 | PIBER0 | P51 | PID1 |
| 80 P52/PID2 | PIBER0 | P52 | PID2 |
| 81 P53/PID3 | PIBER0 | P53 | PID3 |
| 82 P54/PID4 | PIBER0 | P54 | PID4 |
| 83 P55/PID5 | PIBER0 | P55 | PID5 |
| 84 VDD | — | VDD | VDD |

Figure 4:
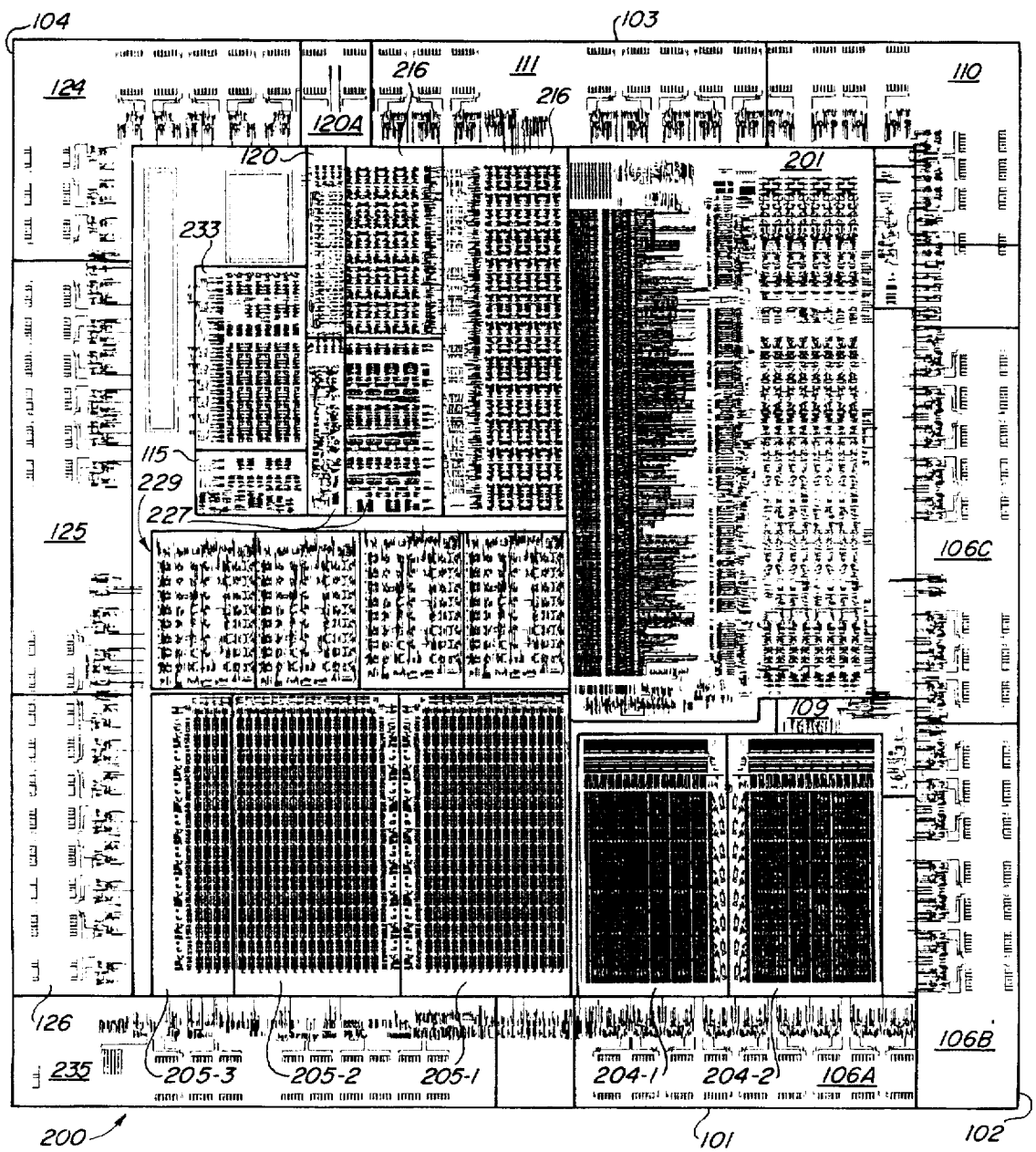
FIG. 4 is a diagram of the poly mask layer for fabrication of the microcomputer of FIG. 3, with the blocks of FIG. 3 superimposed thereon.

Next, the lead or pin functions for microcomputer 200 will be described, and where applicable, their relationship to the chip topography shown in FIGS. 3 and 3A and in FIG. 4 will be explained.

The WEB (write enable) signal (lead 13) is defined as "active low", and is an output with a "high" or "1" level when microprocessor 201 is reading data from an external memory or external I/O that is not present on microcomputer chip 200A (FIG. 3). WEB also is at a high level when it is reading or writing to internal memory, i.e., to SRAM 205, SROM 204, or internal (on-chip) I/O circuits on chip 200. When the WEB input is low, microprocessor 201 is writing to external memory or external I/O. The WEB signal is bi-directional, so that when the BE/RDY lead is low, the WEB signal is an input for DMA (direct memory access) operations to SRAM 205, ROM 204, on-chip registers, or on-chip I/O (i.e., the I/O port buffers). When the BE/RDY lead is at a high level, microprocessor 201 controls the WEB lead as an output.

The RUN/SYNC lead 14 goes low when microprocessor 201 is stopped as a result of a WAI (wait) or STP (stop) instruction, and goes high when microprocessor 201 is running. The RUN/SYNC lead 14 is utilized, for example, to signal an external oscillator and clock system to start FCLK or CLK. When bit 3 of the bus control register is set, the "sync" function causes lead 14 to be pulled to a high level when PHI2 is at its low level. When bit 3 of the bus control register is at a low level (for the normal operating mode), the RUN/SYNC lead 14 is at a high level during the entire PHI2 clock cycle. When RUN/SYNC lead 12 is low, the PHI2 clock signal may be stopped. Execution of a WAI instruction pulls RUN/SYNC lead 12 low when PHI2 is high, and it stays low until an enabled interrupt is requested or until the RES (reset) lead 10 goes from a low to a high level, starting microprocessor 201. The STP (stop) instruction pulls RUN/SYNC lead 12 low when PHI2 is high and stops the internal PHI2 clock. The RUN/SYNC lead 14 remains low and the internal PHI2 clock remains stopped until an enabled interrupt is requested or RES lead 10 goes high.

The FCLK (fast clock) lead 16 can be started or stopped by writing "0" to Bit 0 in the SSCR register of FIG. 1H, and is restarted by writing that bit to a "1" (The slow clock CLK can never be stopped.)

The PHI2 output on lead 20 is the main system clock used by microprocessor 201 for instruction timing, on-chip and off-chip memory accesses, and I/O timing, and also is used by Timers 0–7.

The CLK and FCLK inputs on leads 18 and 16, respectively, are used by the timers for the PHI2 system clock generation, counting events, or implementing real time clock functions. The CLK0 and FCLK0 outputs on leads 19 and 15, respectively, are the inverted CLK and FCLK inputs which are used for oscillator circuits that employ crystals or other time bases.

The BE/RDY (bus enable/ready) input lead 17 controls the address bus, data bus, and WEB (write enable) signals. When RES (reset) LEAD 12 goes high to signal the power-up condition, microprocessor 201 starts. If BE/RDY lead 17 goes low when PHI2 is low, the addresses A0–A23 and WEB lead 13 are input, allowing DMA (direct memory and I/O access) for de-bug purposes. Data from data lines D0–D7 is written to any register being addressed by A0–A23 when WEB is low. Data is read from D0–D7 when WEB is high. Microprocessor 201 is stopped when BE/RDY is low. When BE/RDY is high, A0–A23, D0–D7, and WEB are outputs controlled by microprocessor 201. When BE/RDY is pulled low during PHI2 high time, BE/RDY does not affect the direction of the address bus, data bus, and WEB signals. When BE/RDY is pulled low when PHI2 is high, microprocessor 201 is stopped so that it may be "single stepped" (i.e., operated one machine cycle at a time) in de-bug mode.

The reset (RES) input/output lead 12, which is defined as active low, stops the entire microcomputer 200 and puts it into a static low power state if RES is low for more than two PHI2 cycles. After such a reset, all I/O leads become inputs, and all input and output buffers are disabled. However, the BE/RDY and WEB inputs are unaffected by the RES input. When RES lead 12 goes from a low to a high level, RUN/SYNC lead 14 goes high, and the bus control register in block 235 is initialized to $89 if BE/RDY is low or to $00 if BE/RDY is high. Microprocessor 201 then begins the power-up reset sequence in which its program counter is loaded with a reset vector that points to the first instruction to be executed. RES lead 12 is a bi-directional lead that is pulled low internally for "restarting" due to a "monitor timeout" in which Timer 0 "times out" (i.e., is decremented to zero), thereby causing a system reset.

The Pxx I/O port leads P00–P07, P10–P17, P20–P27, P30–P37, P40–P47, P50–P57, and P60–P67 all are bi-directional. Each bi-directional port has a port data register PDx and a port data direction register PDDx. A "0" in the port data direction register defines the associated I/O port lead as an input with the output driver transistors in an "off" state. A "1" in a port data direction register defines the corresponding I/O port lead as an output. Reading of any port data register involves reading the states of the corresponding I/O port leads. After a reset operation, all I/O port leads become input leads with both the data and data direction registers reset to "0"s.

Port 7 has the above-mentioned chip select register (CSR), that is used to enable chip select leads CSx. The eight chip select signals CS0–CS7 are decoded from the states of various ones of address bus conductors A4–A23. The CS0–CS7 outputs can be used as additional address outputs to select sixteen megabyte blocks of memory. A "1" in bit x of the chip select register of Port 7 enables chip select values to be output on the corresponding lead of Port 7.

The W65C2655 includes memory mapping that allows various ones of the chip select signals CS0–CS7 to be utilized to conveniently select various size blocks of external memory, registers, and input/output circuitry. (Although referred to using the conventional term "chip select" outputs, some of the CS0–CS7 output signals can be used as "card select" or "header select" outputs, as subsequently indicated with reference to FIGS. 6A and 6B.) The chip select outputs CS0–CS7 are individually enabled as outputs on Port 7 by the above-mentioned chip select register CSR. CS7 is automatically enabled by CSR bit 7 being equal to "1". Each of the eight chip select outputs CS0–CS7 is dedicated to one block of memory. The chip select outputs CS0–CS7 are defined as "active low", i.e., are asserted when at a low level. When the same leads are programmed by enable register 210 as chip select outputs, they come up at a high level as a result of a chip reset operation.

Port 0, Port 1 and Port 3 function as address bus ports when the bus control register bits 0 and 7 are set to "1's" and bit 3 is set to "0", for normal operating mode external memory addressing. Address leads A0–A23 are all "1's" when addressing "on-chip" memory. When bit 3 of the bus control register is set to a "1", the address bus is active so that internal read and write operations can be traced in a de-bug mode.

Port 2 can be configured as a data bus port (D0–D7) by the bus control register. When bits 0 and 7 of the bus control register are set to a "1", and bit 3 thereof is set to a "0", D0–D7 are all "1's" when microprocessor 201 is addressing on-chip memory. When bit 3 of the bus control register is a "1", the data bus D0–D7 is "active" so that internal read and write operations can be traced.

Edge interrupt leads PE60 and PE56 have positive edge-sensitive interrupt inputs multiplexed with the I/O functions. When one of these leads is "enabled" as an edge interrupt, as defined by the bus control register, an interrupt is generated and the associated bit is set by an internal one-shot circuit in the interrupt flag register 227B or 227E of FIG. 1C on a positive transition from a "0" to a "1". The transition from a "1" to a "0" has no effect on the interrupt flag register. When the associated interrupt enable register bit is set to a "1", microprocessor 201 will be interrupted, provided the interrupt flag bit in the microprocessor's internal status register is cleared-to a "0". When the interrupt flag bit is a "1", interrupts are disabled.

Similarly, edge interrupt leads NE66, NE64, and NE57 have negative edge-sensitive interrupt inputs multiplexed with the I/O functions of these leads. When the lead is defined as an edge interrupt by the bus control register, an interrupt is generated and the associated bit is set by an internal one-shot circuit on a negative transition from a "1" to a "0". The opposite transition has no effect on the interrupt flag register 227B or 227E. When the associated bit of interrupt enable register 227D or 227G of FIG. 1C is set to a "1", microprocessor 201 will be interrupted provided the interrupt flag bit in the internal microprocessor status register is cleared to a "0", and when the interrupt flag is a "1", interrupts are disabled.

The port signal P41 I/O function is available with the IRQ level-sensitive interrupt input on package lead 71. When IRQ is low the associated interrupt flag is set to a "1" in interrupt flag register 227E. When the associated bit of interrupt enable register 227G is set to a "1", microprocessor 201 will be interrupted, provided its interrupt flag is cleared to a "0" so as to allow interrupts. I/O port lead P40 has its I/O data multiplexed with the NMI (non-maskable interrupt) edge-triggered interrupt and the abort signal ABORT and is controlled by bus control register bit 5. When NMI is selected by bit 6 of the bus control register, microprocessor 201 will be interrupted on all negative edges of NMI.

Each of UARTs 229-0 through 229-3 has a receiver 251 that is enabled when Bit 5 of Asynchronous Control and Status Register 229C is set to a "1", and package leads 4, 6, 8 and 10 become the asynchronous receiver input RXD signals. When transmitter 250 of UART 229 is enabled by Bit 0 of the Asynchronous Control and Status Register 229C, then package leads 5, 7, 9 and 11 become the asynchronous transmitter output TXD signals.

When UARTs 229 are not in use, Timer 4 can be used for counting input negative pulses of TIN or P60. Timer 4 also can be used to generate a square wave or rectangular waveform on TOUT lead 5 (P60). When counting negative pulses on TIN, the TIN frequency should always be less than one-half the frequency of PHI2. TOUT changes state on every timeout of Timer 4. Therefore, the varying waveform frequency depends on the Timer 4 latch values, and may be modified under software control.

The four UARTs provided in microcomputer 200 allow serial port communication capability similar to that of the serial interface bus in my U.S. Pat. No. 5,123,107. Therefore the serial interface bus is omitted, and instead the parallel interface bus (PIB) system shown in FIGS. 1A, 1B and 1F is included to allow as many as 48 bits of data to be transferred between handshakes. Registers PIR2–PIR7 can be pre-loaded via data bus 202.

In accordance with the present invention, chip control logic circuitry 235 contains two oscillators, as shown in FIG. 1H. A fast oscillator 351, which may be triggered by a crystal oscillator 35 or other suitable time base, may oscillate at a high frequency rate, for example 4 megahertz. Fast clock oscillator circuit 351 can be stopped by a software controlled input 353, which is connected to bit 0 of the SSCR register. Fast clock oscillator 351 produces a fast output clock signal FCLK on conductor 354A, which is input to a gate circuit that divides PCLK by 4 if a signal SLOW is present and provides the result on conductor 354. That signal is applied to a logic circuit including two-input AND gates 355 and 358 having their outputs applied to a NOR gate 356, the output of which is produced on conductor 357 and inverted again to produce the internal signal PHI2.

Conductor 354 also is applied to an input of the synchronizing circuit 362, which generates an enable signal on conductor 364 that is applied to one input of AND gate 358, and also is inverted by inverter 363 and applied to one input of AND gate 355.

A second oscillator, slow oscillator circuit 359, is triggered by a slow crystal circuit 360 at, for example, 32 kilohertz. Slow clock oscillator circuit 359 generates a 32 kilohertz squarewave CLK on, conductor 361, which is supplied as another input to synchronizing circuit 362. The enable or oscillator select signal 370 comes from the SSCR register Bit 1. Conductor 361 is connected to one input of two input NAND gate 358.

Following is a description of the modifications to the prior art portion of the clock circuitry shown in FIG. 1H to effectuate the automatic speed and power control features of the present invention: The output 354A of FCLK oscillator 351 is connected to the input of a divide-by-four circuit 365. The output of divide-by-four circuit 365 is connected to an input of AND gate 366A. An enable input of divide-by-four circuit 365 receives the signal SLOW on conductor 368 and is connected by conductor 368 to the other input of AND gate 366A and to an input of an inverter 369. The signal "SLOW" selects the FCLK÷4 rate for PHI2. The output of inverter 369 is connected to an input of AND gate 366B, the other input of which is connected to the output of FCLK oscillator 351. The outputs of AND gates 366A and 366B are connected to inputs of NOR gate 366C, the output of which is coupled by inverter 367 to conductor 354.

The STOP FCLK (bit 0 of the SSCR register) is connected to one input of NOR gate 373, the other input being connected to conductor 364A. The output of NOR gate 373 is inverted by inverter 374 and connected to conductor 353.

The signal SLOW is produced in response to bits 3–7 of the SSCR (speed control register) 130A and the CS3–CS7 register bits. When SLOW is at a "0" level, as a result of one of SSCR bits 3–7 being a "1" and corresponding to one of CS3–CS7 which also is at a "1", then the speed of the signal on conductor 354 is the speed of FCLK oscillator 351. When SLOW is at a "0" level, the speed of the signal on conductor 354 is the FCLK÷4 rate.

The connection of conductor 364A to one input of NOR gate 373 operates to prevent PHI2 from switching from the FCLK or FCLK÷4 rate to the CLK rate until synchronization is complete.

The synchronizing circuit requires that the fast oscillator circuit 351 run substantially faster (at least three or four times faster) than the slow clock oscillator circuit 359. The stop SCLK signal on conductor 353 is produced in response to bit 0 of the SSCR register.

This dual oscillator arrangement allows the microcomputer 200 to be utilized for very low power consumption applications, wherein the internal clock can be selected to operate at the slow 32 kilohertz rate supplied by slow oscillator circuit 359, greatly reducing AC power dissipation. Whenever high speed operation is needed, the fast clock oscillator 351 can be selected by providing an enable signal on conductor 353 and allowing enough time for the fast oscillator signal to stabilize (typically a few milliseconds) during which the slow clock oscillator signal continues to be produced on conductor 357 and used by the entire microcomputer 200. Then, under software control (bit 1 of the SSCR register), control of the main system clock signal PHI2 on conductor 357 is switched over from the slow CLK frequency of oscillator 359 to the FCLK signal produced on conductor 354 by the fast clock oscillator circuitry 351.

A "monitor" program can be stored in an on-board ROM or an external ROM, the monitor including a collection of routines to perform power management functions which use the above clock speed switching features to control power dissipation. The power management portion of the monitor controls the PHI2 speeds at which various portions of on-chip memory, external memory, and peripheral devices are operated, using the FCLK÷4 speed for accessing external memory and peripheral devices, and where appropriate, for accessing on-board memory.

Figure 1J:
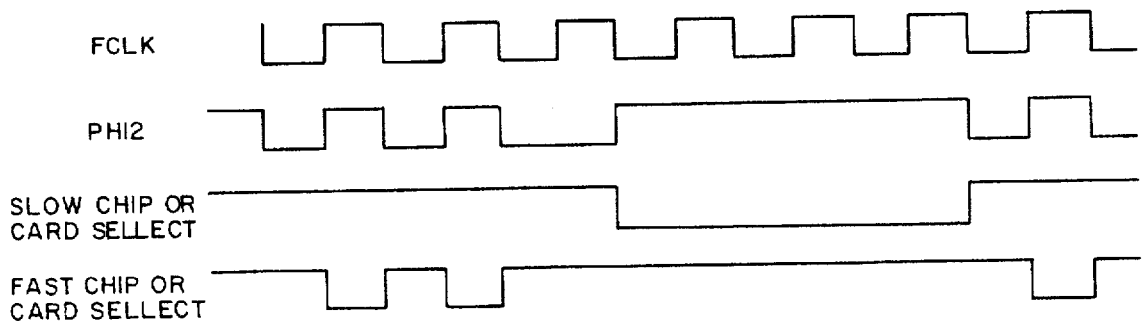
FIG. 1J is a timing diagram useful in explaining automatic slowing of the system clock frequency to effectuate accessing a slow memory and to reduce chip power dissipation.

To this end, the system speed control register allows the internal clock signal PHI2, which clocks the entire microcomputer chip 200, to be selected under program control to be CLK (which might be very slow, eg. 32 kHz), FCLK (which might be 4 MHz), or FCLK÷4 (e.g., 1 MHz). This allows microcomputer 200 to operate at very low power under standby conditions by setting bit 1 of the SSCR register to "0" to select CLK. Maximum speed operation can be achieved by setting Bit 1 of the SSCR register to "1" and Bit 3 thereof to "1" to select FCLK. Reduced high speed performance to allow convenient access to slow external memory or to reduce chip power by a factor of four can be achieved by setting Bit 1 to "1" and Bit 3 to "0" in the SSCR register to select FCLK÷4 to be PHI2. Above described FIG. 1H shows the schematic diagram of the circuitry needed to accomplish such operation. Bits 4–7 of the SSCR register determine which one of the corresponding chip select outputs CS4–CS7 operates at the FCLK rate or the FCLK÷4 rate, provided that Bit 3 of the SSCR register is at a "1". If Bit 3 of the SSCR register is at a "0", the entire chip operates at the FCLK÷4 rate regardless of what Bits 4–7 of the SSCR register are set to. The timing diagram of FIG. 1J shows how the main microcomputer clock PHI2 is equal to FCLK divided by 4 whenever the "slow memory select" (i.e., a "slow chip select", or a "slow card select") condition is established by the above described coincidence of a chip select output signal and a "0" in a corresponding bit of the SSCR register (provided SSCR Bit 3 is a "1"). The timing diagram of FIG. 1J also shows how PHI2 remains at the FCLK frequency whenever the "fast memory select" (i.e., a "fast chip select" or "fast card select") condition is established by the above described coincidences of a chip select output signal and a "1" in a corresponding bit of the SSCR register (assuming, of course, that SSCR Bit 3 is at a "1"). Typically, CS4–CS7 are used to select various blocks of external memory.

In accordance with another aspect of the present invention, a plurality of external "bus holding circuits" such as the one shown in FIG. are connected to various external bus conductors. Each bus holding circuit contains a first low power CMOS inverter 332 having an input connected to an external bus conductor 331 and an output connected to the input of another low power CMOS inverter 333 having its output connected to the external bus conductor 331. The output impedance of inverter 333 is so high (i.e., a few hundred kilohms to several megohms) that the external or internal circuitry connected to the external bus conductor 331 can easily "overpower" inverter 331 and force a changed state. The bus holding circuits, however, ensure that if microcomputer 200 is connected in a configuration in which a particular external bus line is unconnected to anything, a bus holding circuit will hold it in a particular state, preventing anomalous test results due to indeterminate levels on unused external bus conductors when the output driver circuits connected thereto are in high impedance states. (See my U.S. Pat. No. 5,212,800, issued May 18, 1993.) The bus holding circuits can be used to advantage during operation of the power control portion of the subsequently described monitor to "quiet" the external I/O buses not presently being used, the internal buses being "quieted" by a WAIT state.

To make use of the power management flexibility afforded by the program selectable speeds of PHI2 and the ability to conveniently address small on-chip or external pages or blocks of memory, a power management routine of a "monitor" program usually will be transferred into SRAM 205. The power management routine performs the functions of determining which external and internal buses of microcomputer 200 should be "inactivated" or "quiet" and establishing the appropriate "inactive" bus conductor voltage levels, which then are maintained using the bus holding devices of FIG. 1I. The power management routine also determines which buses are required for the present application (such as responding to an input from a keyboard, a timer, or an external peripheral device). The power management routine also determines, on the basis of information in the program currently being executed, which of the available speeds to select for PHI2 while pages of various internal and external memories are accessed. The power management routine also determines when to inactivate all buses and the states they are to assume when microcomputer 200 goes into a low power standby mode.

Figure 2:
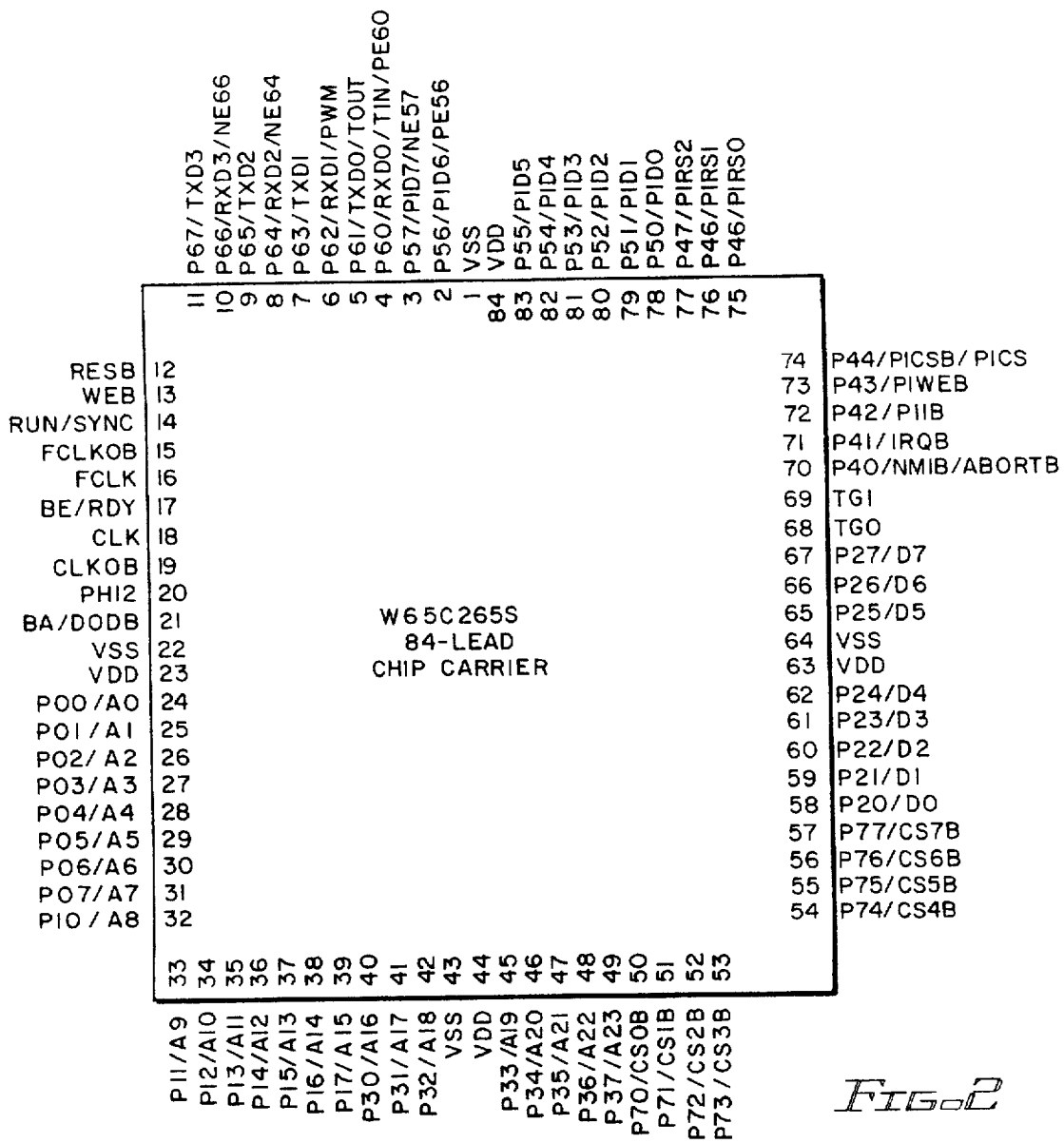
FIG. 2 is a diagram illustrating the relative locations of the 68 leads of the microcomputer of FIGS. 1A and 1B.
Figure 2A:
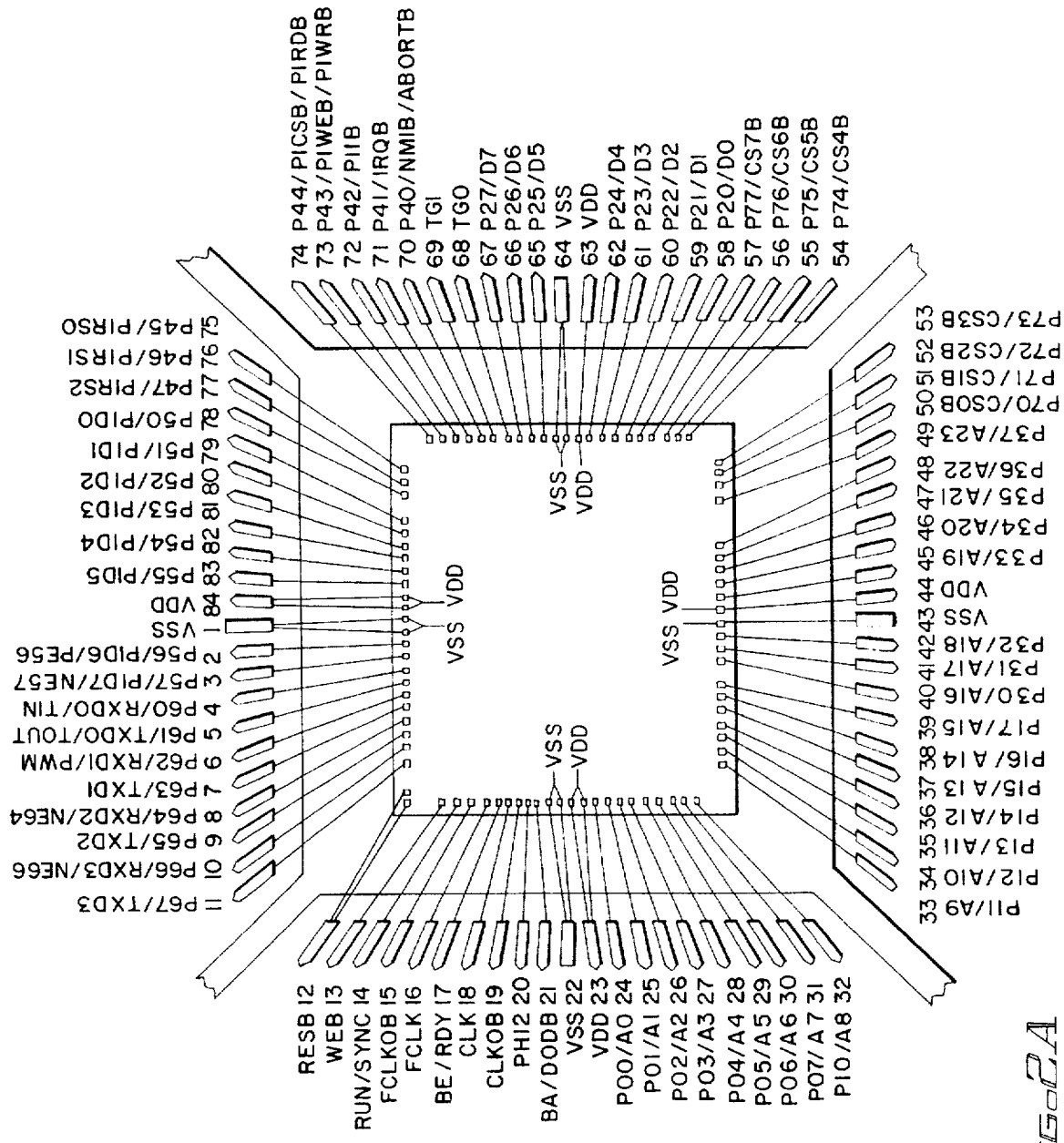
FIG. 2A is a wire bonding diagram illustrating which bonding pads of the microcomputer chip are connected to the various leads of the package of FIG. 2.

FIG. 2 shows the "package lead numbers" and multiplexed lead signal assignments for the 84 lead carrier in which the single chip microcomputer 200 can be packaged.

FIG. 3 shows the locations of the areas within a single chip wherein the various blocks in FIGS. 1A and 1B are located in accordance with the present invention. Where appropriate in FIG. 3, areas are designated by the same reference numerals used to designate the circuitry therein. The areas shown in FIG. 3 are also shown superimposed on the polycrystalline silicon mask layer shown in FIG. 4. The chip control logic area 235 in FIG. 3 includes circuitry connected to RES (reset) lead 12, the WE (write enable) lead 13, RUN/SYNC lead 14, FCLKO (fast clock out) lead 15, FCLK (fast clock) lead 16, BE/RDY (bus enable/ready) lead 17, CLK (clock) lead 18, CLKO (clock out) lead 19, and PHI2 output lead 20.

Chip control logic 235 is placed along the upper half of edge 101 of the microcomputer chip 200, partly to allow convenient usage of the topography of microcomputer chip 200 of FIG. 3 as a "core" of a larger microcomputer system (300 as shown in FIG. 3A), and partly to allow the lower part of microcomputer chip 200 along edge 101 to be used for the lower order A0–A7 address buffers. BE/RDY lead 17 and its associated circuitry in section 235 are "sandwiched" between FCLK lead 16 and CLK lead 18 to which two external oscillators are connected to provide electrical isolation between the two to thereby reduce interaction between the two oscillators. PHI2 lead 20 and its associated circuitry are separated as much as possible from the clock oscillator connected to CLK lead 18. Similarly, RUN/SYNC lead 14 is separated as much as possible from the fast oscillator connected to FCLK lead 16, in order to isolate the oscillators as much as possible from signals that could produce undesirable "cross-talk" in the fast and slow oscillators.

Address buffers A8–A15 are laid out in section 106B of FIG. 3 along the left part of edge 102, and need to be as close as possible to lower order address buffers A0–A7 in section 106A. Address buffers A16–A23 are laid out in area 106C along the mid-portion of edge 102.

Memory map decode circuitry 109 of FIG. 3 includes decode circuitry in block 212 of FIGS. 1A and 1B to decode addresses A0–A23 in order to select various conveniently sized blocks of external or internal memory. Various combinations of the address bits A0–A23 and chip select outputs CS0–CS7 can be decoded to select various blocks of internal or external memory, allowing the remaining address bits to address words within the selected blocks. Since the memory map decode circuit 109 decodes the signals produced by microprocessor 201 and selects chip select buffers in block 110 of FIG. 3, memory map decode circuit 109 is most conveniently located between microprocessor core 201 and ROM 204-2, adjacent to address buffer section 106B because address buffers of reduced size can be used in core microprocessor 201, available for memory map decode circuitry 109.

Having some of the chip select leads on the same side 102 of microcomputer chip 200 as address leads A8–A23 is an advantage in using the microcomputer 200 as a "core" in a larger monolithic chip such as 300 in FIG. 3A or on a printed circuit board so the chip select output conductors CS0–CS7 can be conveniently routed along with the A8–A23 conductors to address external memory and/or external I/O circuitry on a printed circuit board.

The W65C618S microprocessor referred to above is located in section 102, such that its "high order address buffers" ABH8–ABH23 are as close as possible to sections 106A and 106B, respectively, to effectuate efficient connection thereto.

A major difference between the W65C134S described in U.S. Pat. No. 4,123,107 and the W65C265S of the present invention is that the W65C265S has many more external leads, (84 compared to 68), much more SRAM and SROM, three more UARTs, four more Timers, tone generators, a parallel I/O bus, and a much more powerful sixteen bit core microprocessor. These differences presented a number of significantly different chip layout problems than the prior art microcomputers to achieve an optimum solution. After much balancing and evaluation of various layout possibilities, it was concluded that the location of the microprocessor core 201 and the SROM should be reversed for the W65C134S, even though bus routing had to be greatly modified.

Referring to FIG. 3, microprocessor core 201 is located in the lower right portion of the chip adjacent to address buffer 106C, SSCR circuitry 130A which includes SSCR Bits 2–7, chip select buffers 110, and the lower part of data bus buffer 111.

SROM sections 204-1 and 204-2, one stacked on the other as shown in FIG. 3, are located in the lower left portion of chip 200, between microprocessor core 201 and address buffers 106A, and adjacent to and above address buffers 106B. The combined height of SROM sections 204-1 and 204-2 matches that of microprocessor core 201.

SRAMs 205-1 and 205-2 are "stacked" on SROM 204-1 as shown. SRAM sections 205-1 and 205-2 are somewhat wider than the SROMs. SRAM section 205-3 is "stacked" on SRAM area 205-2 and is of the same width, as shown.

Conductors of address bus 203 extend around chip 200, as indicated by dotted lines 203, and conductors of data bus 202 extend around chip 200 as indicated by dashed lines 202. Dashed-dotted lines 215 indicate how conductors of I/O control bus 215 extend around chip 200. Numeral 203-A indicates the extent of 12 address bus conductors needed to address SROMs 204-1 and 204-2, and numeral 202-B indicates the further extent of eight of those address conductors needed to address SRAMs 205-1, 205-2, and 205-3. The narrow width of SROMs 204-1,2 allows room for routing the larger number of 12 address conductors 203A through the address decode sections of SROMs 204-1,2.

UARTs 229A-D are essentially identical to the single UART in the W65C134S. However, their layouts were redesigned so that the areas required for the four of them would "stack" up to the same "height" as SRAMs 205-1,2,3.

Interrupt (IRQ) logic 227 needs to be connected to all four UARTs, all eight Timers 0–7, and parallel interface bus (PIB) circuitry 233. To this end, Timers 0–4 and half of Timer 5 are located along the upper edge of microprocessor core 201 in the area between UART 0 and data bus buffers 111. Interrupt circuitry 227 is located above Timers 0–2, and the other half of Timer 5 and Timers 6 and 7 are located between interrupt circuitry 227 and data bus buffers 111. Twin tone generator circuitry 120 was designed to fit between the interrupt control port of interrupt circuit 227 and tone buffers 120A.

Timer control logic 115 is located above the interrupt control circuitry to allow its efficient connection to port 5. Timers 0–7, and interrupt control circuitry 227. Parallel interface bus (PIB) circuitry 233 is located above interrupt control circuitry 227 and tone generator circuitry 120 to allow efficient connection to both port 5 and interrupt control circuitry 227.

Chip select decode circuitry 144, which performs the function of decoding addresses to produce CS0–CS7, is located between the lower right corner of microprocessor core 201 and the chip select buffer area of port 7 because address lines A16–A23 are used for generation of most of the chip select outputs.

Bits 0 and 1 of system speed control register (SSCR) 130B are located in area 130B between low order address buffer 106A and bus control register 142 because they need to be close to the clock generation circuit in block 235, despite difficulties in routing the data bus. Bits 2–7 of the SSCR register are located in area 103A between address buffer 106C (port 3) and chip select buffer 110 (port 7) because they are used to effectuate the power and speed control functions that involve the chip select output generators in block 110.

Numeral 203C indicates where address bus conductors A0 to A13 extend to Timers 0–7. Numeral 203D shows how the address bus conductors A0 to A3 extend into the PIB logic 233. Numerals 203E show connection of the address bus conductors to the corresponding address output buffers in core microprocessor 201. The address conductors 203A and 203B conveniently extend from the bottom to the top of the chip through the address decoders of SROMs 204-1 and 204-2 and SRAMs 205-1, 2, and 3. The address bus conductors 203 form a large loop surrounding microprocessor core 201. UARTs 0–3, the PIB circuit 233, Timers 0–7, IRQ circuit 227, and tone generators 120. Similarly, data bus conductors 202 form a large loop around the periphery of microcomputer chip 200 (but within the port 0–6 buffers), as do the I/O control bus conductors 215. The formation of such loops by the various address, data, and I/O control bus conductors reduces the effective bus conductor resistances by approximately 50 percent, substantially reducing bus signal propagation delays.

Numerals 202A show how the data bus conductors extend into SROMs 204-1 and 204-2. Numerals 202B show how the data bus extends into SRAMs 205-1,2,3. Numeral 202C shows the data bus extending from port 5 to timer control logic 115 and PIB logic 233. Numeral 202D shows the data bus extending to IRQ logic 227 and Timers 0–7. Numeral 202E shows the data bus extending the internal data bus buffer of core microprocessor 201.

The D0-D7 data bus buffer circuitry is located adjacent to the I/O Port 2 peripheral circuitry in section 111 of microcomputer chip 200A, as shown in FIG. 3 because it needs to be close to address buses, and needs to be close to the internal data buffers of microprocessor core 201.

Port 0 is located along the lower portion of edge 101. Port 1 and port 2 are located along the left and middle portions of edge 102, respectively. Chip select port 7 is located in the lower right corner of chip 200 along both edges 102 and 103. Data bus buffer and I/O Port 2 circuitry is located in section 111 along the middle port of edge 103, immediately to the right of microprocessor core 201. I/O port 4 circuitry is located in the upper right corner of chip 200 along edges 103 and 104. Tone buffer 120 is located along edge 103 between port 2 and port 4. I/O port 5 circuitry 125 and port 6 are located along the middle and left portions of edge 104, respectively. The chip control logic circuitry is located along the upper part of edge 101.

Bus control register (BCR) bits 3 and 7 are located in area 142 adjacent to chip control logic 235 because these bits are needed close to the speed control circuit of FIG. 1H within block 235.

UARTs 229 also need to be connected to data bus 202 and coupled to the TXD 0-3 and RXD 0-3 conductors in Port 6 area 126. This determines their locations as shown in FIG. 3.

At this point, it should be noted that for microcomputer 200 to function as a "core" of a larger computer system chip such as the one shown in FIG. 3A, it was recognized that circuitry for "task processing", which can include interrupt handling, tone generation for audio prompting or DTMF signaling, parallel peripheral device interfacing (such as LCD display control), and connections to other computing elements (eg., to interface to an IBM PC) needs to be located adjacent to the upper right portion of microcomputer 200 because the interrupt circuitry, timers 0–7, the tone generator circuits, and the parallel interface bus circuitry all are located nearby.

It was recognized that in a larger microcomputer system using a microcomputer "core", it usually would be most convenient, from the viewpoint of routing of address and data bus conductors, to have all of the external memory and addressable external I/O blocks adjacent to a particular edge of the microcomputer 200 and to avoid the need to route data bus and address bus conductors to opposite sides of the microcomputer core. This is achieved by placement of the "task processing" circuitry on an opposite side of the microcomputer core and also placement of other circuitry, such as serial communications circuitry that would communicate with UART 229 and parallel interface bus unit 223 on a side of the microcomputer core 200 opposite to the memory, I/O, and register logic.

The desire to locate all of memory, addressable I/O, and register circuitry in a common area toward one side of the microcomputer core led to placement of the chip select outputs in line along the periphery of microcomputer 200 adjacent to the high order address buffers in section 106C. This led to placement of the memory map decode circuitry in area 109 to achieve the desired memory segmentation described above. These considerations also led to placement of buffer areas 106A, 106B, 109, 110, 111, 124, 125, and 126 around the periphery of microcomputer chip 200 as shown in FIG. 3.

FIG. 3A shows a large computer system chip 300 that includes the topography of microcomputer chip 200 of FIG. 3 as a "core". Chip 300 includes an "external" memory system 301 located along bottom edge 300A of microcomputer 200. Memory system 301 abuts address buffer sections 106A, 106B, and 106C memory map decode section 109, chip select section 110, and data bus buffer section 111. This configuration of microcomputer 200 effectuates optimum routing of address lines A0–A23, various ones of chip select lines CS0–CS7, and data bus lines D0–D7 through external memory system 301, and allows very effective segmentation of external memory system 301 and very efficient addressing of selected segments by microcomputer 200. A serial communications system 302 is located in the upper left corner of chip 300, abutting chip control logic 235 in microcomputer core 200. The above mentioned task processing subsystem 303, implemented as an ASIC (application specific integrated circuit) is located in the upper righthand corner of chip 300, and abuts sections 125, 124, and 120A of microcomputer 200, where all of the above-described edge-sensitive interrupt circuitry and level-sensitive interrupt circuitry is located.

The above described microcomputer chip 200 has a number of important advantages over the prior W65C134S microcomputer, including the capabilities of tone generation for audio prompting and DTMF signaling, providing a pulse width measurement (PWM) function, more serial communications ports, a parallel I/O interface, 256 times more on-chip directly accessible memory then the W65C134S, easy direct access to external memory, and automatic control of system clock speed to minimize power dissipation in accordance with the speed of internal or external memory or peripheral devices currently being accessed.

Figure 6A:
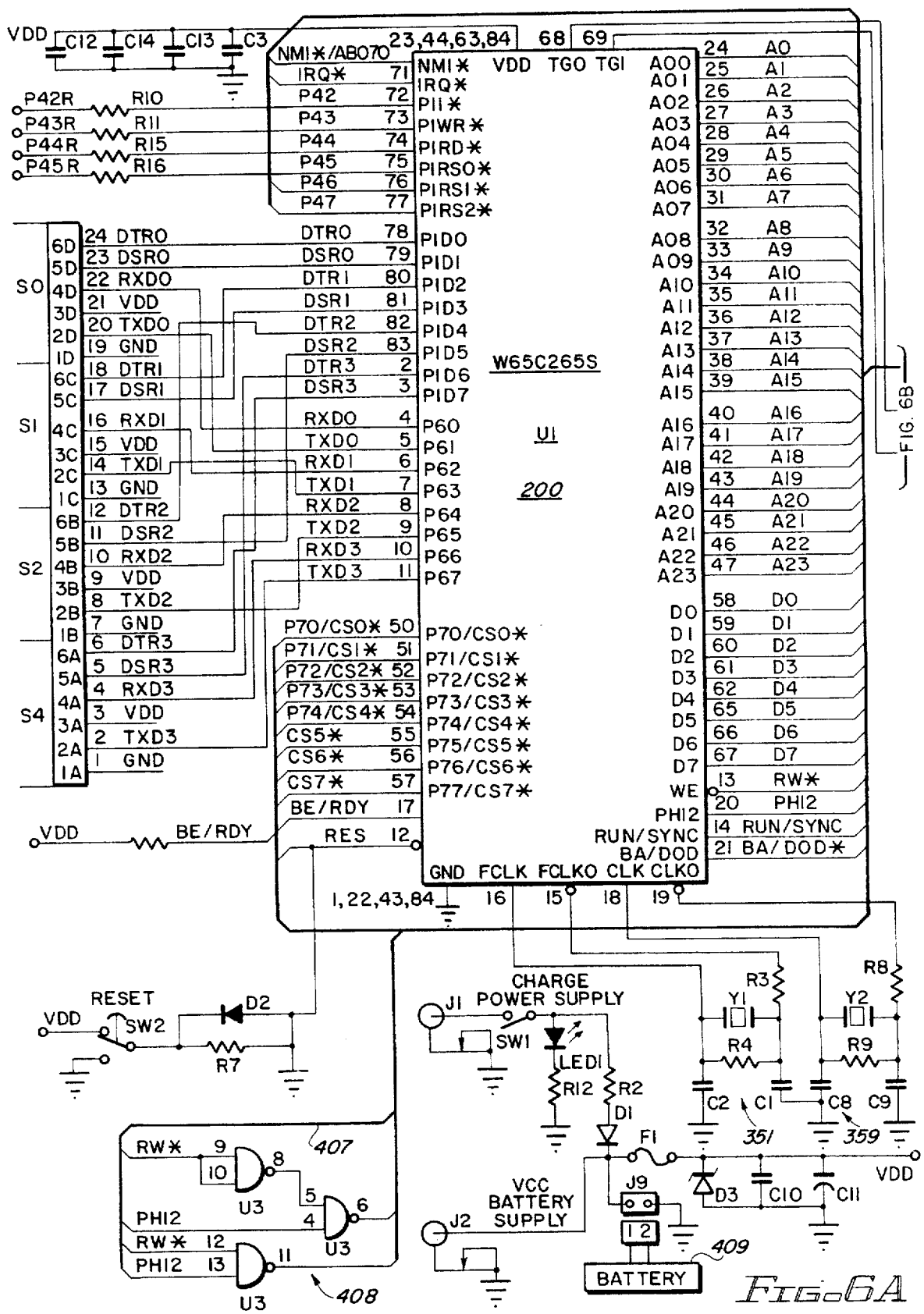

FIGS. 6A and 6B illustrate a portable computer 400 based on the W65C265S microcomputer chip 200 in which the power dissipation can be advantageously managed by the speed/power control function of the monitor mentioned above. Computer 400 includes a rechargeable battery 409 that is continuously charged by an external trickle charger connected to jack 410. However, if computer 400 is operated from battery 409 for extended times, miminizing the power dissipation is very important. To this end, the speed/power control monitor mentioned above operates to select the slowest acceptable (CLK, FCLK÷4, or FCLK) speed of PHI2 to operate a display (not shown), a keyboard (also not shown) connected to ports 50–53, an external speaker system 401, slow external RAM 402, and/or slow external EPROM 403, and also "deactivates" buses not presently being used. This can greatly increase the amount of time computer 400 can operate before rechargeable battery 409 becomes discharged (at which point the LCD screen display becomes inoperative). Computer 400 includes a pair of standard PCMCIA (Personal Computer Memory Card international Association) card slots 405 and 406, which are selectable by CS5 ("card select 5") and CS6 ("card select 6"), respectively. The user can simply plug in any PCMCIA compatable memory card containing software which then can be executed without use of an operating system (such as DOS), resulting in a low cost, high speed (depending on the frequencies of oscillators 351 and 359), low power computer. Computer 400 also includes a male internal expansion "header" 404 which is selectable by CS7 and has the 68 pins identified in FIG. 6A and 6B. This allows connection of external modules to expand the capability of computer 400 in a flexible manner. For example, an Intel 86486 chip could be included on a PC board plugged into header 404 to increase the computing capability of computer 400.

Figure 5A:
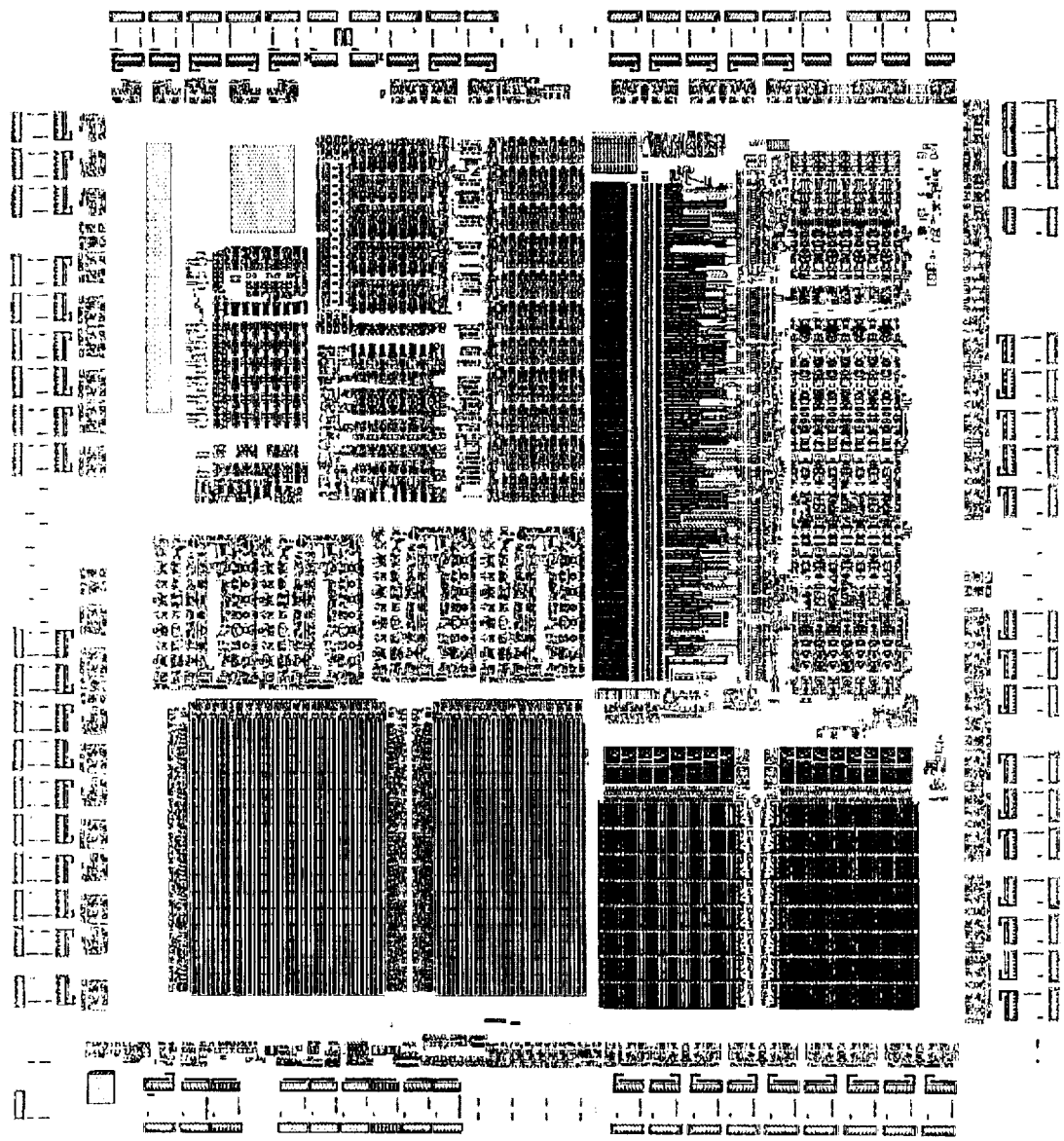

FIG. 5A is a scale plot of the mask layer used to form P well diffusions in the manufacture of microcomputer 200. All of the closed areas in the mask layer would be black, of course, but for convenience, the same information has been plotted on paper.

Figure 5B:
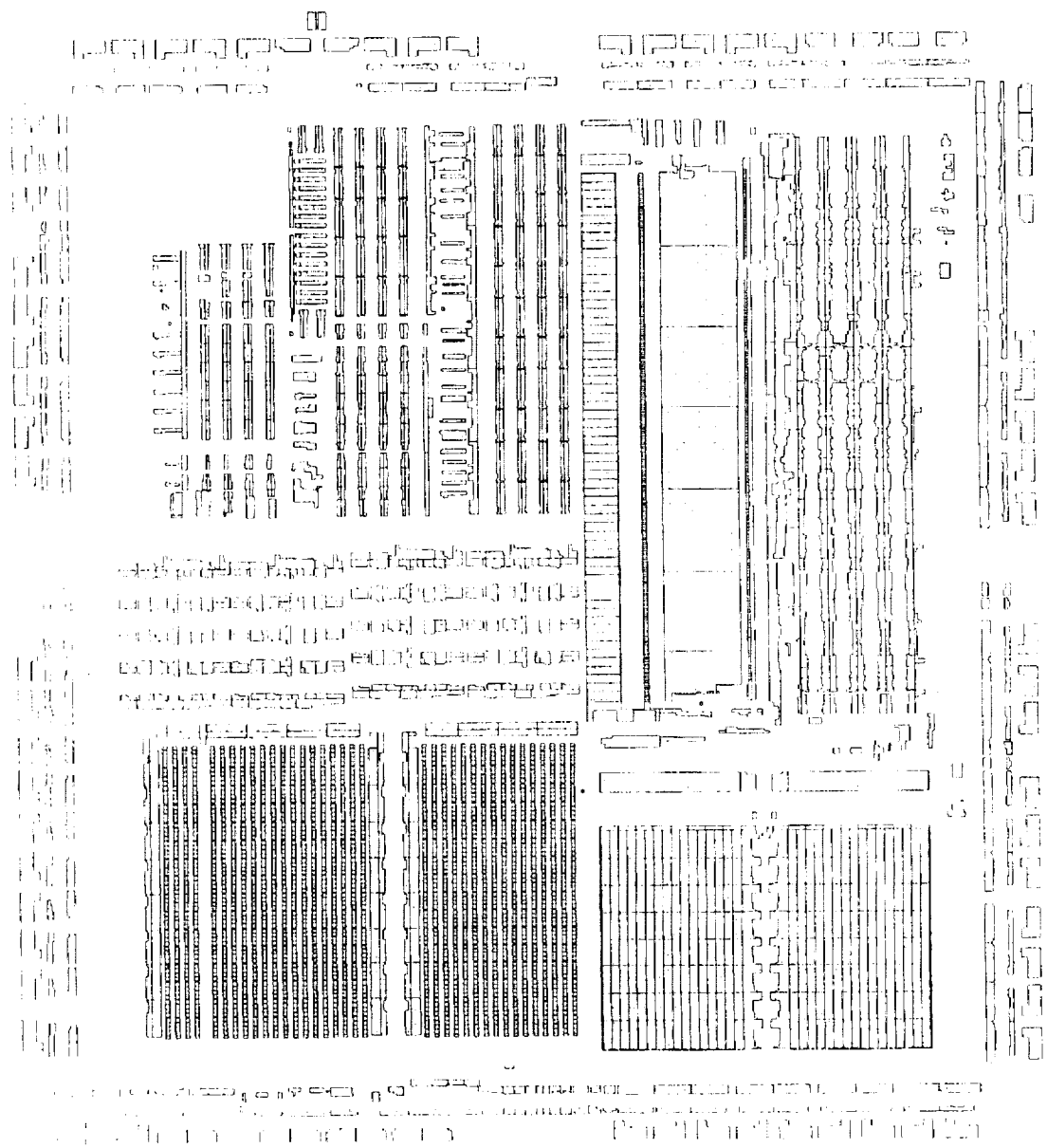

FIG. 5B is a scale computer plot of the mask used for forming the P-type source and drain regions and the N-type source and drain regions in the manufacture of microcomputer 200.

Figure 5C:
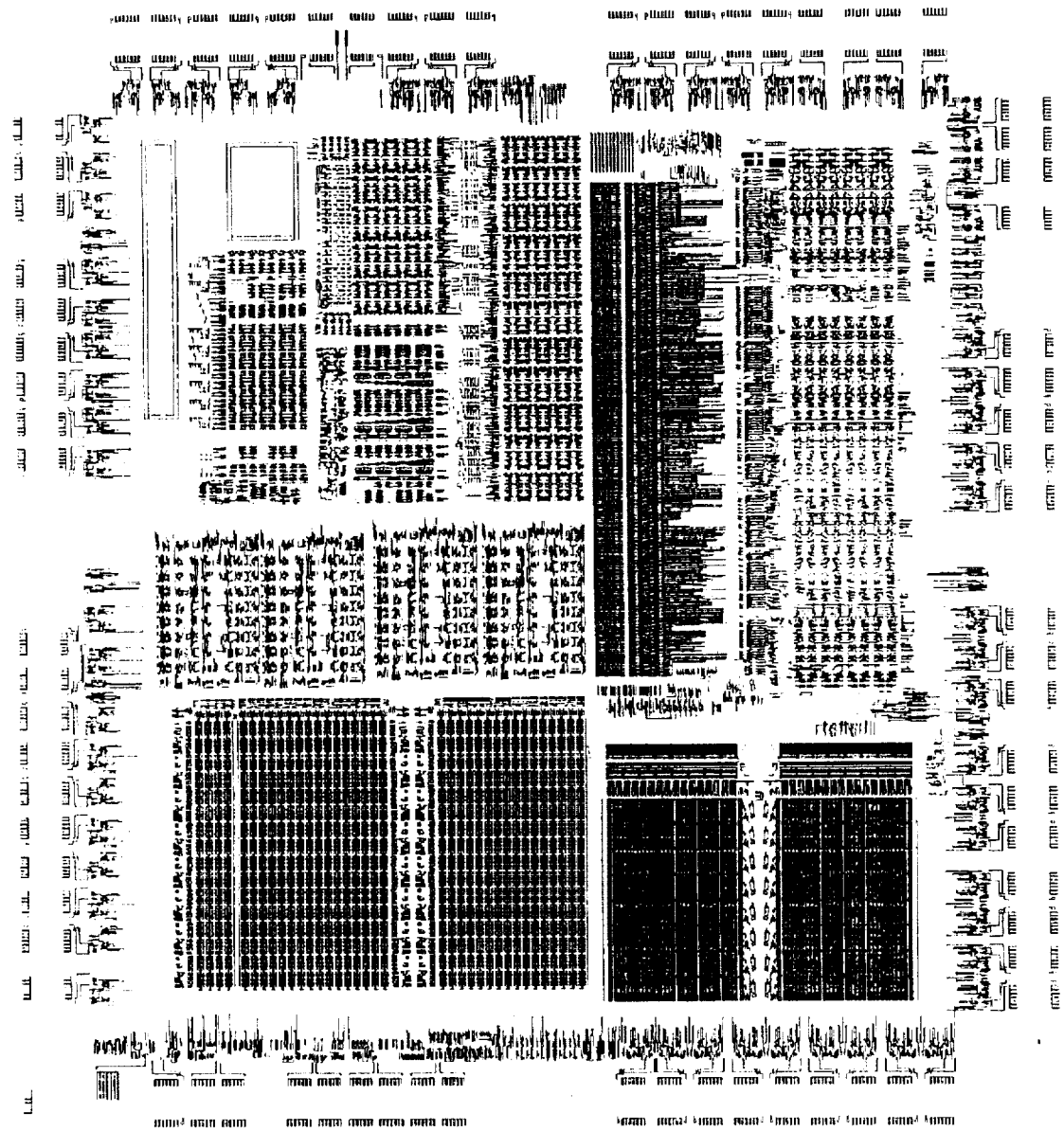

FIG. 5C is a scale computer plot of the mask used in patterning the polycrystalline silicon layer in the manufacture of microcomputer 200.

Figure 5D:
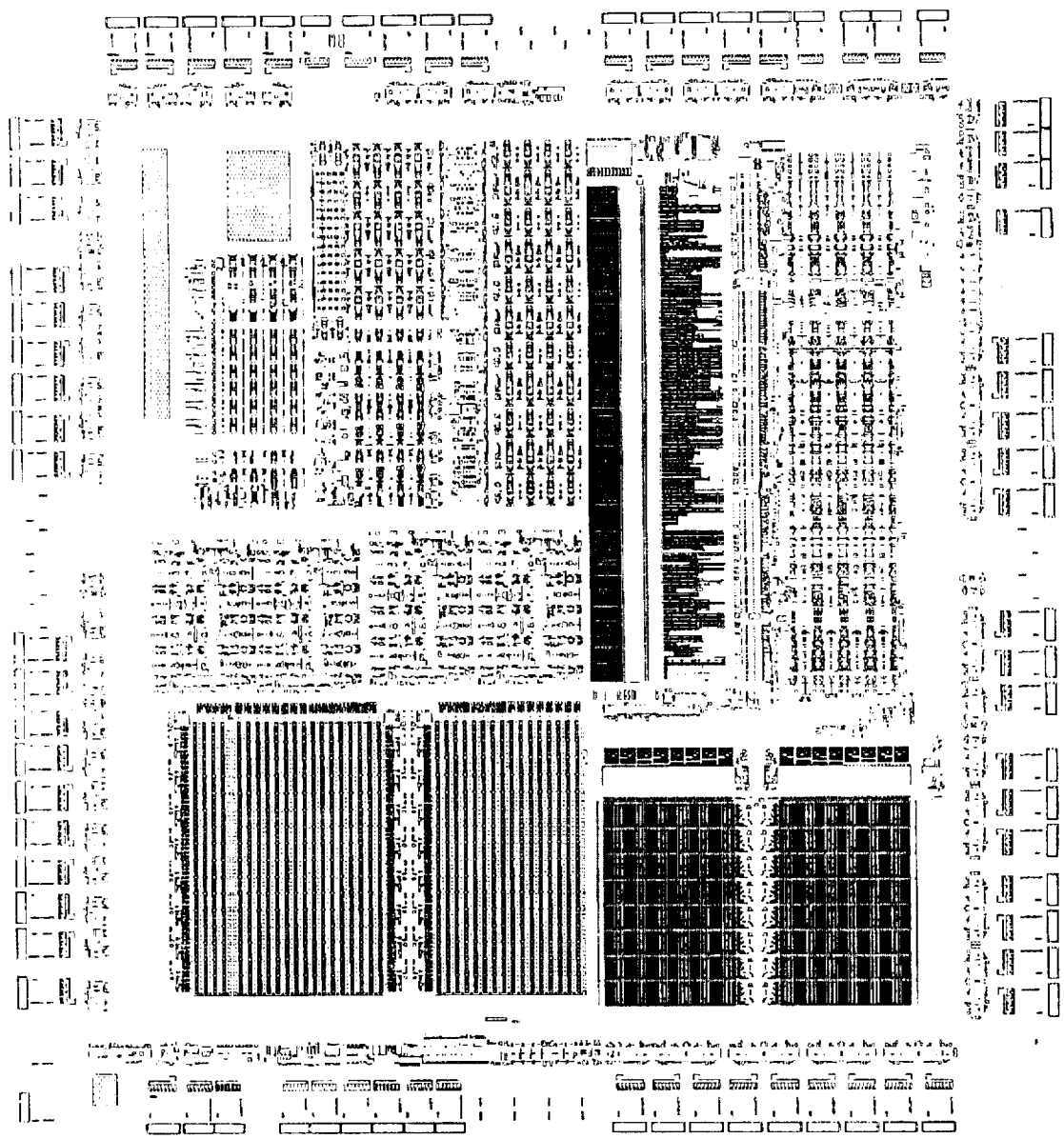

FIG. 5D is a computer plot of the mask defining the N+implants defining source and drain regions of N-channel MOSFETs in microcomputer 200.

Figure 5E:
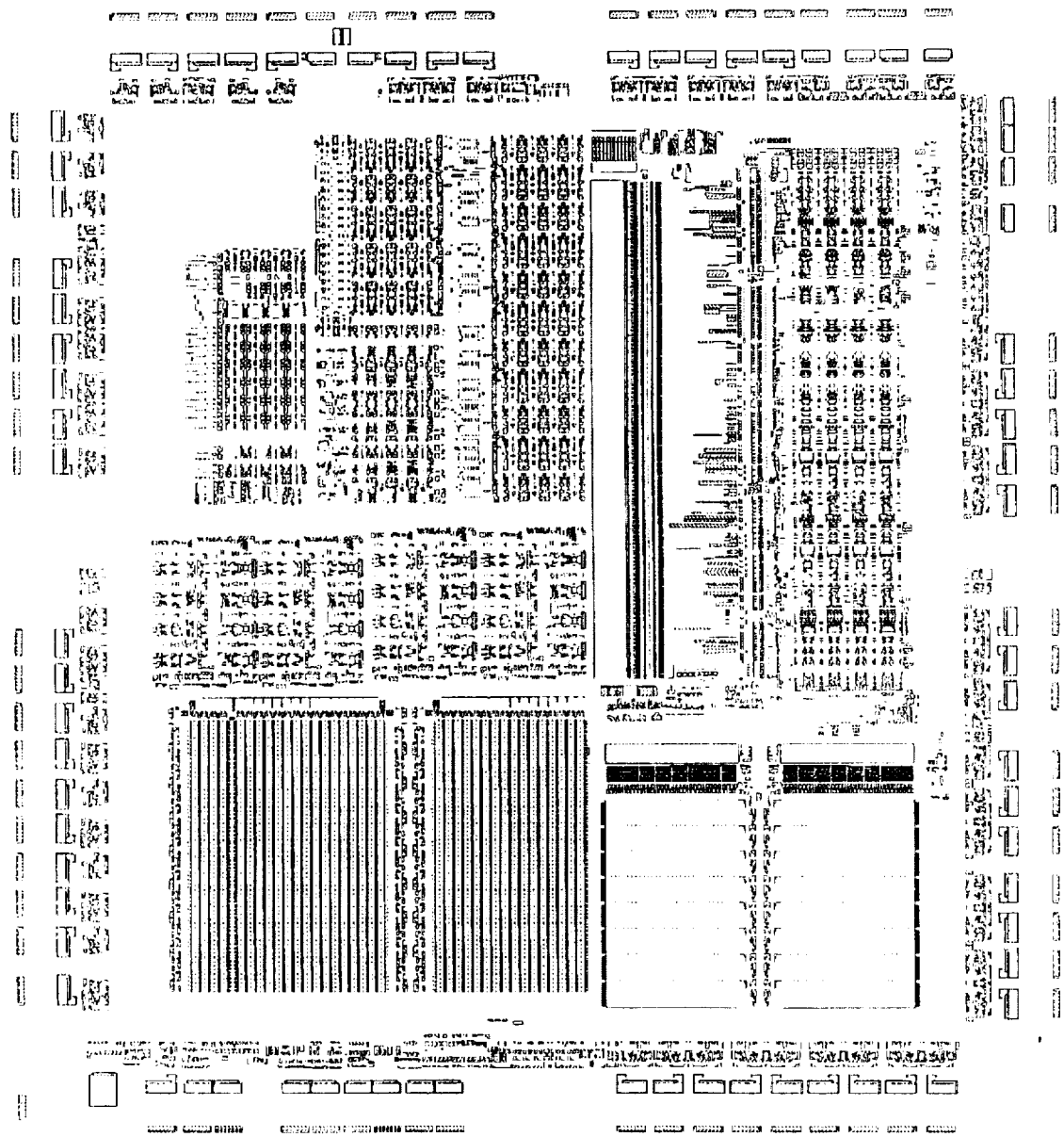

FIG. 5E is a scale computer plot of the mask defining the P+implant regions for the sources and drains of P-channel MOSFETs in microcomputer 200.

Figure 5F:
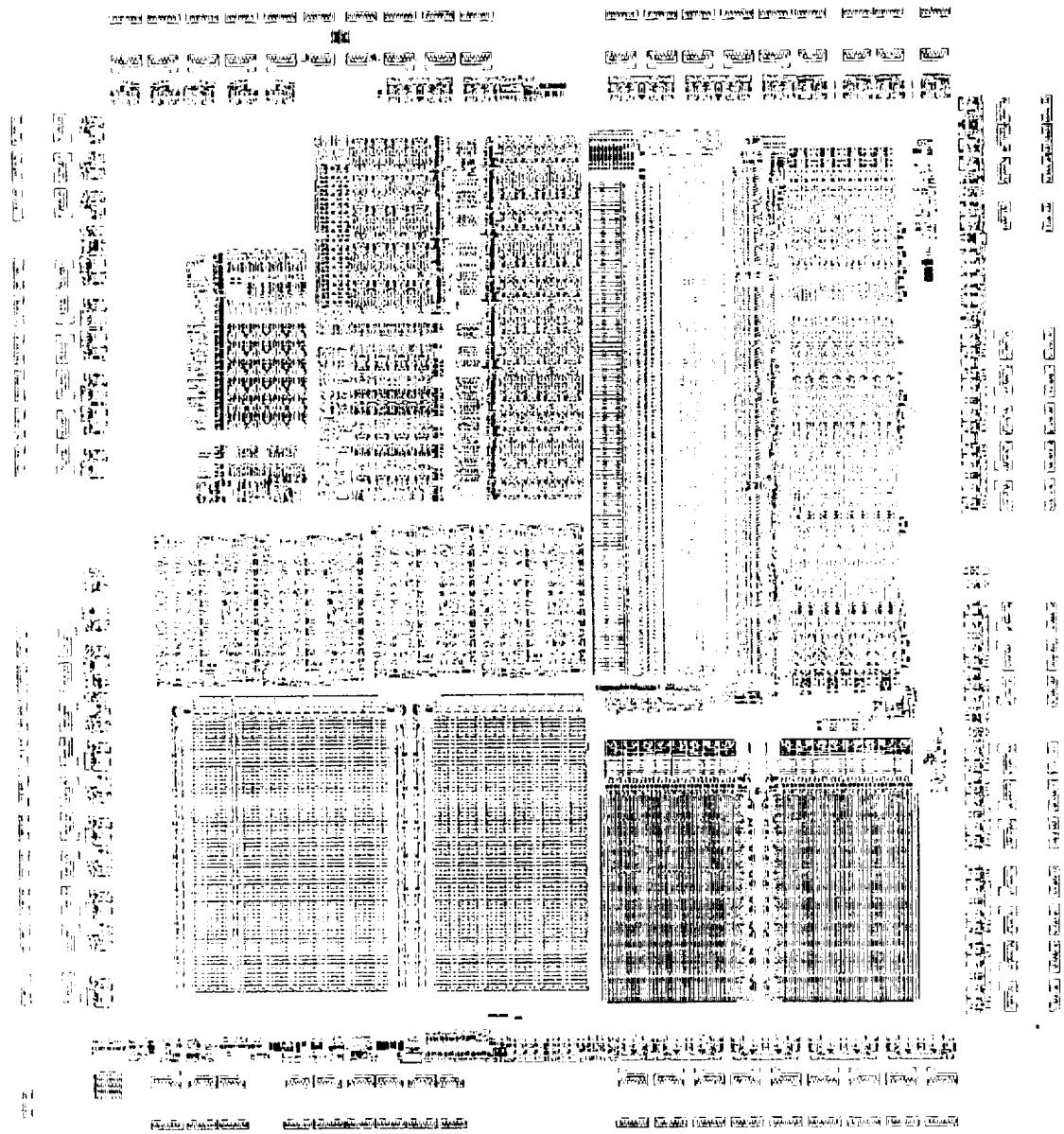

FIG. 5F is a scale computer plot showing all of the metal-to-silicon and metal-to-polycrystalline silicon contacts in microcomputer 200.

Figure 5G:
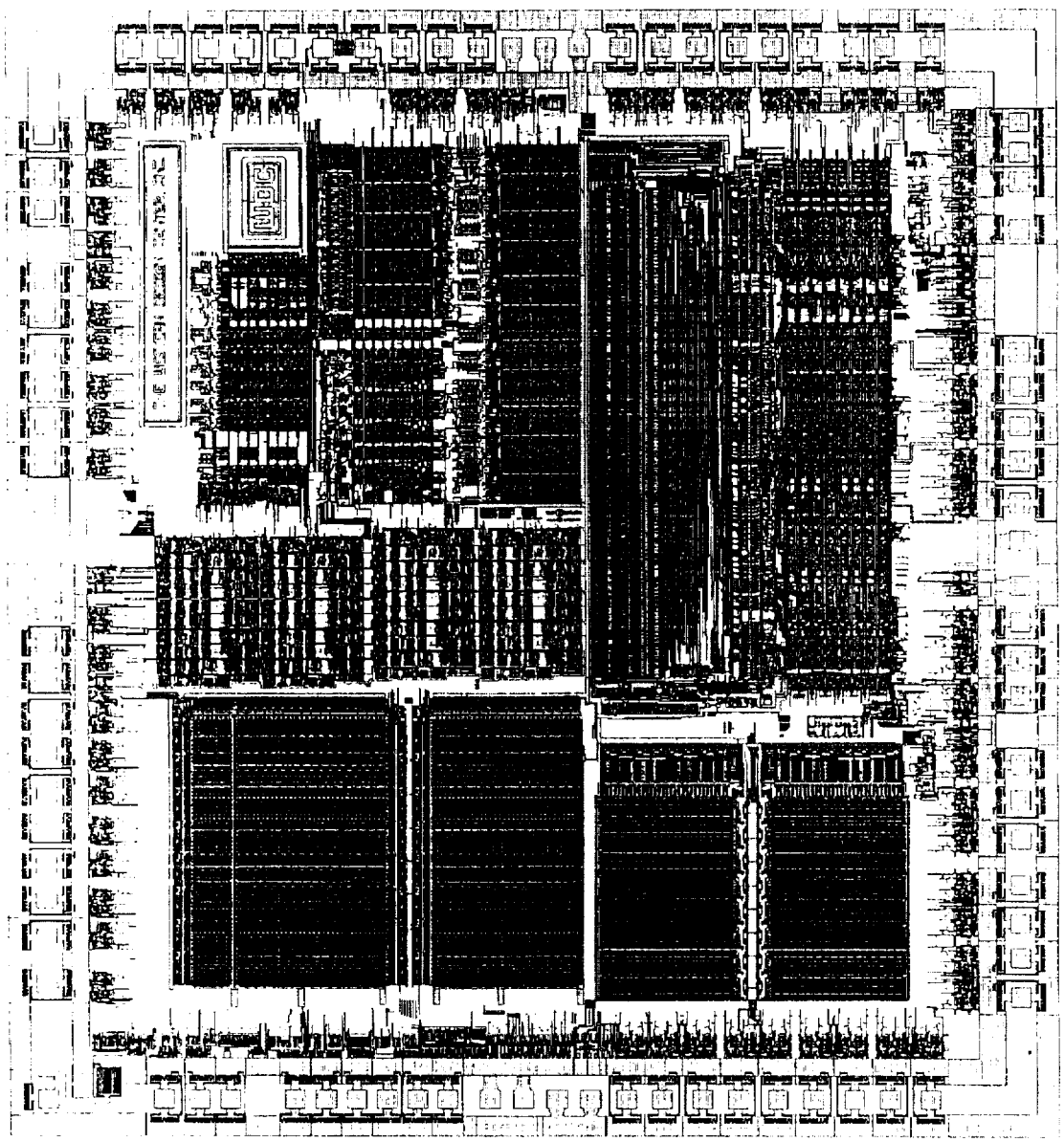

FIG. 5G is a scale computer plot identifying the locations of the N-type well regions formed during the manufacture of microcomputer 200.

Figure 5H:
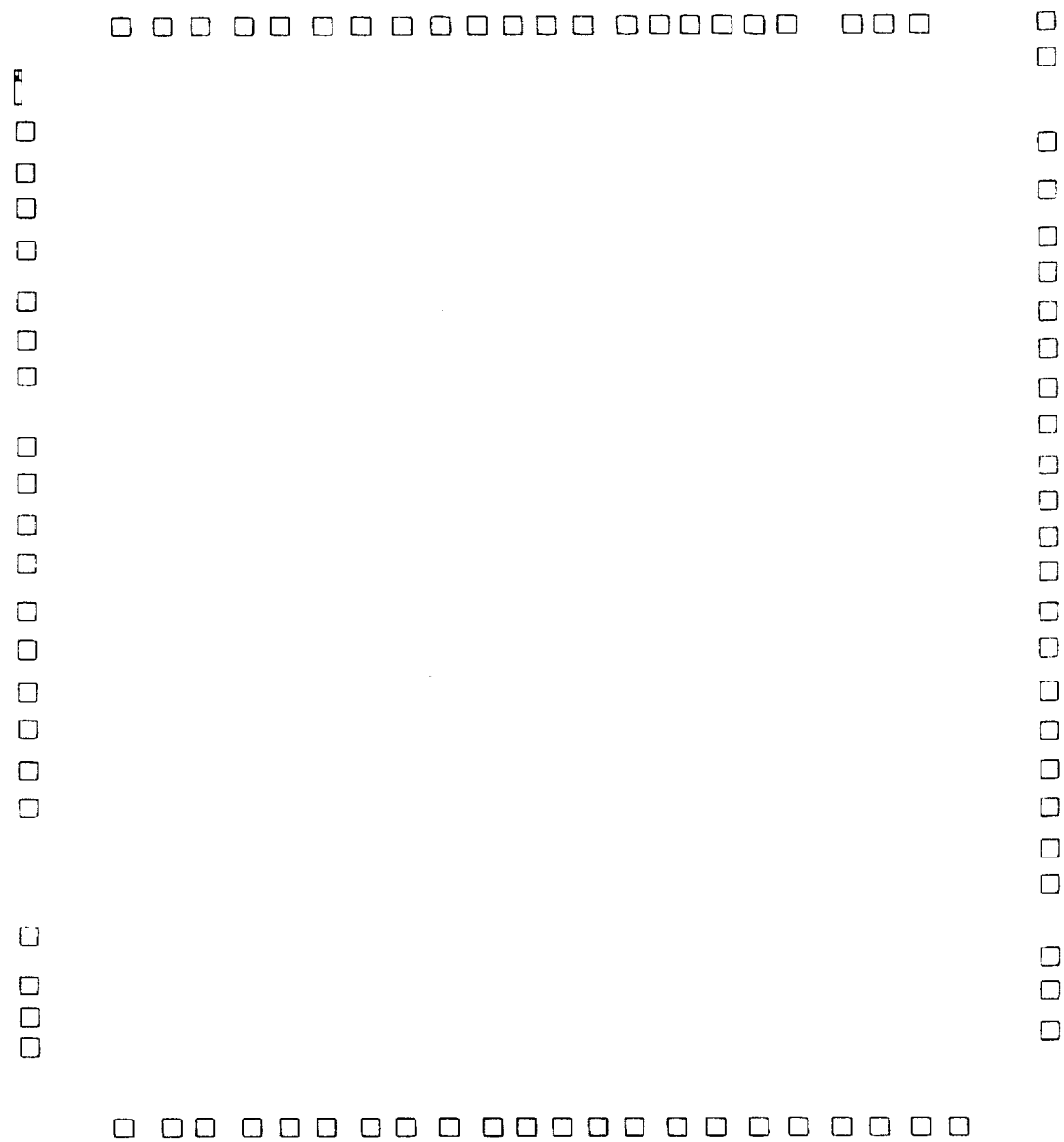
Figure 51:
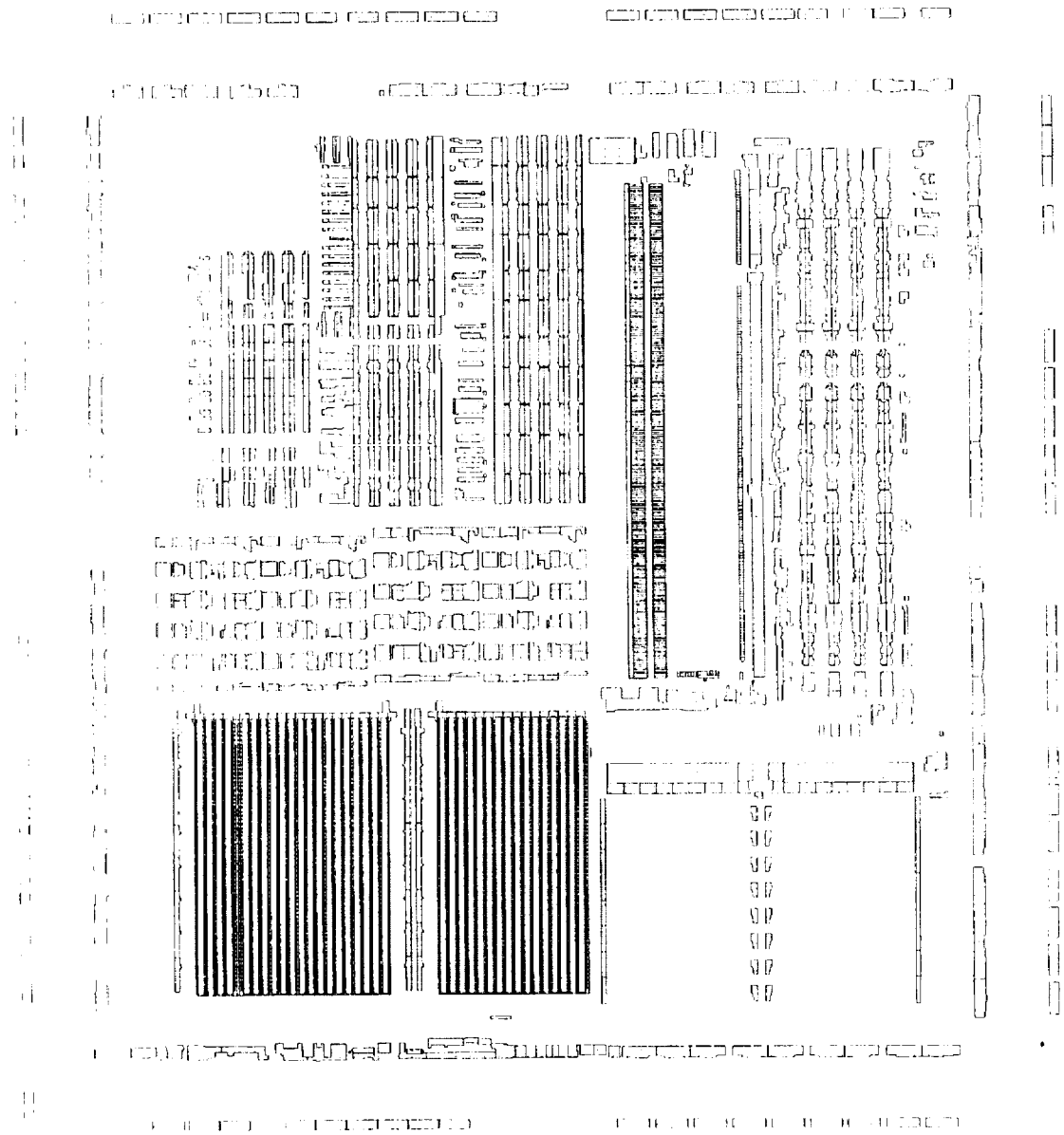
Figure 5J:
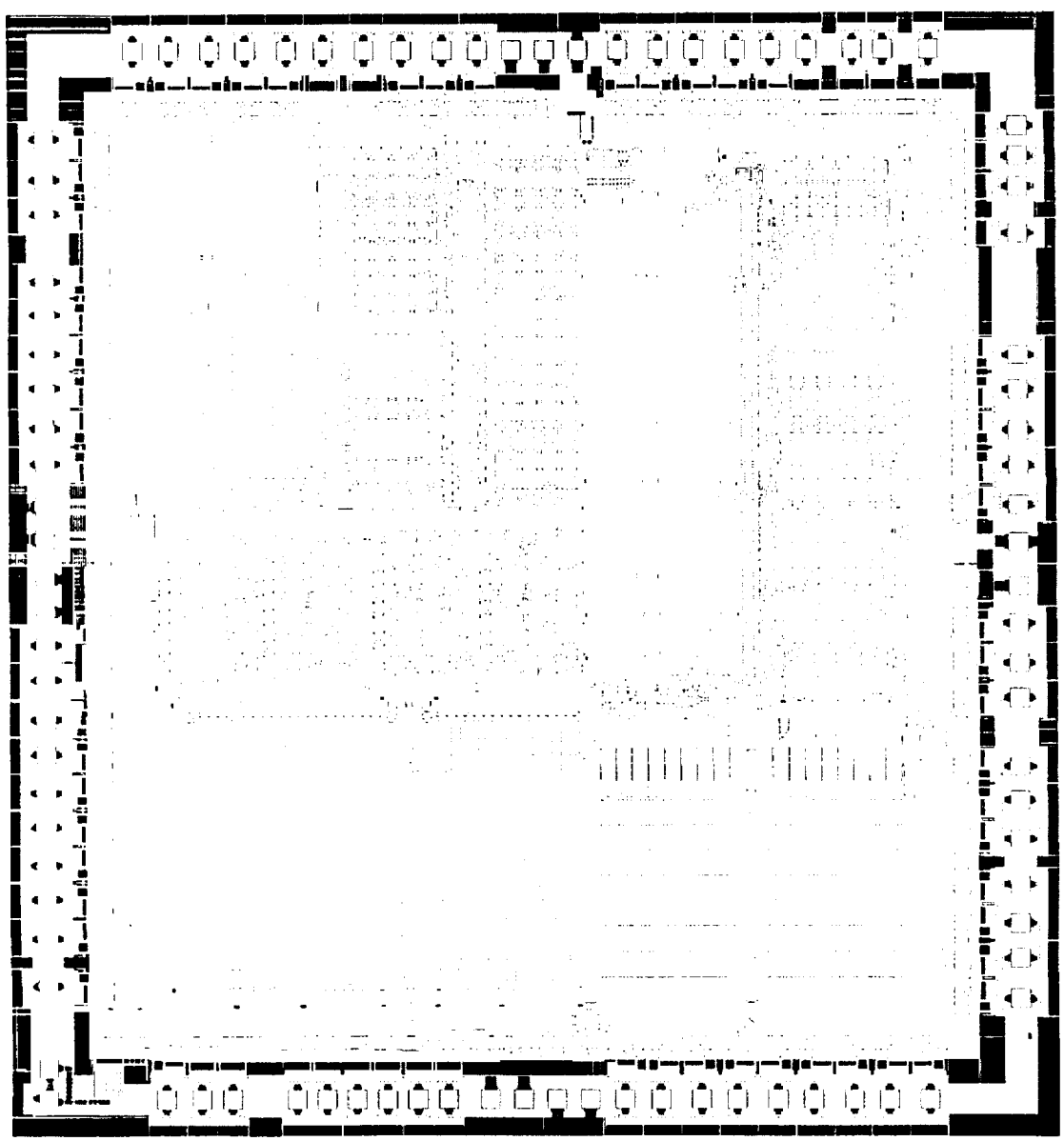
Figure 5K:
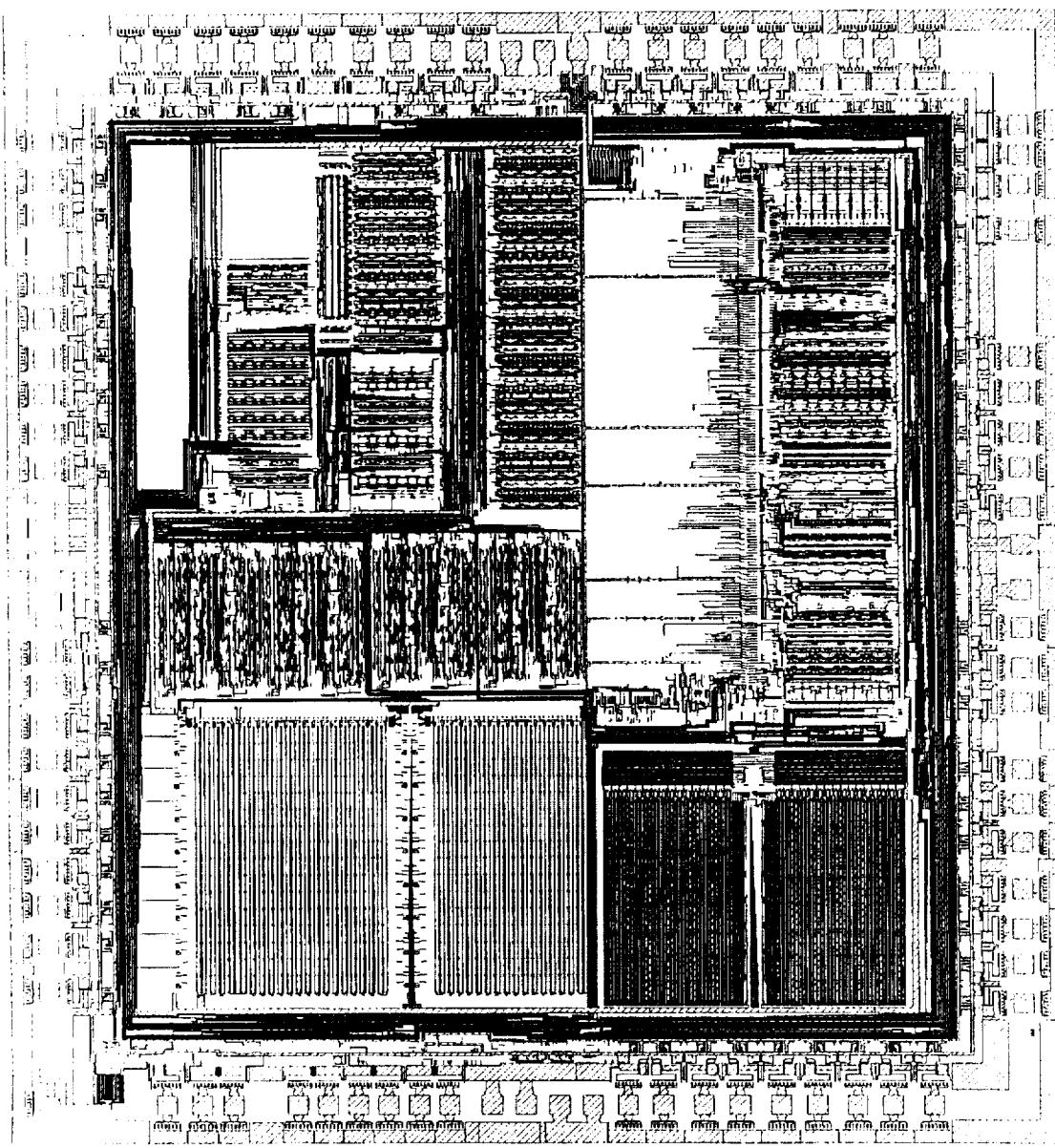

FIGS. 5I–5H are scaled computer plots of additional layers used in the manufacture of microcomputer 200.

FIG. 5H is a scale computer plot of the metal layer formed in the manufacture of microcomputer 200.

While the invention has been described with reference to a particular embodiment thereof, those skilled in the art will be able to make the various modifications to the described embodiments of the invention without departing from the true spirit and scope of the invention.

By way of definition, what is meant by the statement that PHI2 clocks the "entire" microcomputer chip is that the entire memory bus and microprocessor core sections are clocked at the selected frequency of PHI2, even though timers 0–7 operate according to the selectable clock rates.

What is claimed is:

1. A method of operating a CMOS microcomputer to minimize power dissipation while accessing a plurality of memories including a first memory operable at a first frequency, a second memory operable at a second frequency, the first frequency being higher than the second frequency, the method comprising the steps of:

(a) operating the entire CMOS microcomputer at the first frequency while accessing the first memory, causing the CMOS microcomputer to dissipate power at a first level;

(b) determining from a user program currently being executed that it is necessary to access the second memory; and (c) in response to the determining of step (b), operating the entire CMOS microcomputer at the second frequency while accessing the second memory, causing the CMOS microcomputer to dissipate power at a second level which is lower than the first level.

2. The method of claim 1 wherein the first memory is internal to the CMOS microcomputer and the second memory is external to the CMOS microcomputer, and wherein step (b) includes executing the program to set a first speed control bit to a first level indicating that the second memory is to be accessed at the second frequency.

3. The method of claim 2 including selecting the second frequency as a system clock frequency for the entire CMOS microcomputer in response to the first level of the first speed control bit.

4. The method of claim 3 including dividing a fast clock having the first frequency by a predetermined factor in response to the first level of the first speed control bit to derive the second frequency.

5. The method of claim 4 wherein the CMOS microcomputer includes a plurality of chip control outputs, the method including selecting the second frequency as the system clock frequency in response to a coincidence of one of a plurality of speed control bits and a corresponding one of the plurality of chip control outputs.

6. The method of claim 4 wherein the CMOS microcomputer includes a speed control register and a chip select output decoder that decodes memory addresses to produce a plurality of chip select output signals, the method including operating the program to enter information into bits of the speed control register to determine whether a fast clock source or a slow clock source is to be selected to determine the frequency at which the entire CMOS microcomputer operates, to determine whether a signal from the fast clock source is to be divided to derive a divided down frequency at which the entire CMOS microcomputer operates, and to determine which of the plurality of chip select output signals must be produced in coincidence with information in the speed control register to cause the entire CMOS microcomputer to operate at the divided down frequency.

7. A method of operating a CMOS microcomputer to minimize power dissipation while accessing a plurality of memories including a first memory operable at a first frequency, a second memory operable at a second frequency, the first frequency being higher than the second frequency, the method comprising the steps of:

(a) operating the entire CMOS microcomputer at the first frequency while accessing the first memory, causing the CMOS microcomputer to dissipate power at a first level;

(b) determining from a user program currently being executed that it is necessary to access the second memory; and (c) in response to the determining of step (b), operating the entire CMOS microcomputer at the second frequency while accessing the second memory, causing the CMOS microcomputer to dissipate power at a second level which is lower than the first level, wherein the CMOS microcomputer includes a programmable speed control register and a chip select output decoder that decodes memory addresses to produce a plurality of chip select output signals, and also includes a programmable chip select register adapted to enable the various chip select outputs, the method including operating the program to enter information into bits of the speed control register to determine whether a fast clock source or a slow clock source is to be selected to determine the frequency at which the entire CMOS microcomputer operates, to determine whether a signal from the fast clock source is to be divided to derive a divided down frequency at which the entire CMOS microcomputer operates, and operating the program to enter information into bits of the chip select register to determine which of the plurality of chip select output signals must be produced in coincidence with information in the speed control register to cause the entire CMOS microcomputer to operate at the divided down frequency.

* * * * *